(12) United States Patent
Cros et al.

(10) Patent No.: US 9,000,793 B2
(45) Date of Patent: Apr. 7, 2015

(54) FINE PITCH PROBES FOR SEMICONDUCTOR TESTING, AND A METHOD TO FABRICATE AND ASSEMBLE SAME

(71) Applicant: Advantest America, Inc., Baldwin Park, CA (US)

(72) Inventors: Florent Cros, Baldwin Park, CA (US); Lakshmi Namburi, Baldwin Park, CA (US); Ting Hu, Baldwin Park, CA (US)

(73) Assignee: Advantest America, Inc., San Jose, CA (US)

( * ) Notice: Subject to any disclaimer, the term of this patent is extended or adjusted under 35 U.S.C. 154(b) by 285 days.

(21) Appl. No.: 13/744,194

(22) Filed: Jan. 17, 2013

(65) Prior Publication Data

US 2014/0132300 A1    May 15, 2014

Related U.S. Application Data

(60) Provisional application No. 61/727,039, filed on Nov. 15, 2012.

(51) Int. Cl.
 *H01L 21/00*   (2006.01)
 *G01R 1/067*   (2006.01)
 *G01R 1/073*   (2006.01)

(52) U.S. Cl.
 CPC ....... *G01R 1/06722* (2013.01); *Y10T 29/49002* (2015.01); *G01R 1/06716* (2013.01); *G01R 1/07357* (2013.01)

(58) Field of Classification Search
 USPC ....................................... 324/755.05, 755.07
 See application file for complete search history.

(56) References Cited

U.S. PATENT DOCUMENTS

| | | | |
|---|---|---|---|
| 6,019,612 A * | 2/2000 | Hasegawa et al. | 439/73 |
| 6,232,669 B1 | 5/2001 | Khoury | |
| 6,359,454 B1 | 3/2002 | Khoury | |
| 6,420,884 B1 | 7/2002 | Khoury | |
| 6,466,043 B2 | 10/2002 | Khoury | |
| 6,472,890 B2 | 10/2002 | Khoury | |
| 6,535,003 B2 | 3/2003 | Aldaz | |
| 7,764,152 B2 | 7/2010 | Kuitani | |
| 8,097,475 B2 | 1/2012 | Kuitani | |
| 8,237,461 B2 | 8/2012 | Kitasume | |
| 8,241,929 B2 | 8/2012 | Kuitani | |
| 2004/0104737 A1 * | 6/2004 | Haga et al. | 324/754 |
| 2009/0325424 A1 * | 12/2009 | Aarts et al. | 439/676 |
| 2010/0244867 A1 * | 9/2010 | Chong et al. | 324/754 |

* cited by examiner

*Primary Examiner* — Vincent Q Nguyen
(74) *Attorney, Agent, or Firm* — Manuel de la Cerra

(57) ABSTRACT

An apparatus for testing electronic devices is disclosed. The apparatus includes a plurality of probes attached to a substrate; each probe capable of elastic deformation when the probe tip comes in contact with the electronic; each probe comprising a plurality of isolated electrical vertical interconnected accesses (vias) connecting each probe tip to the substrate, such that each probe tip of the plurality is capable of conducting an electrical current from the device under test to the substrate. The plurality of probes may form a probe comb. Also disclosed is a probe comb holder that has at least one slot where the probe comb may be disposed. A method for assembling and disassembling the probe comb and probe comb holder is also disclosed which allows for geometric alignment of individual probes.

20 Claims, 22 Drawing Sheets

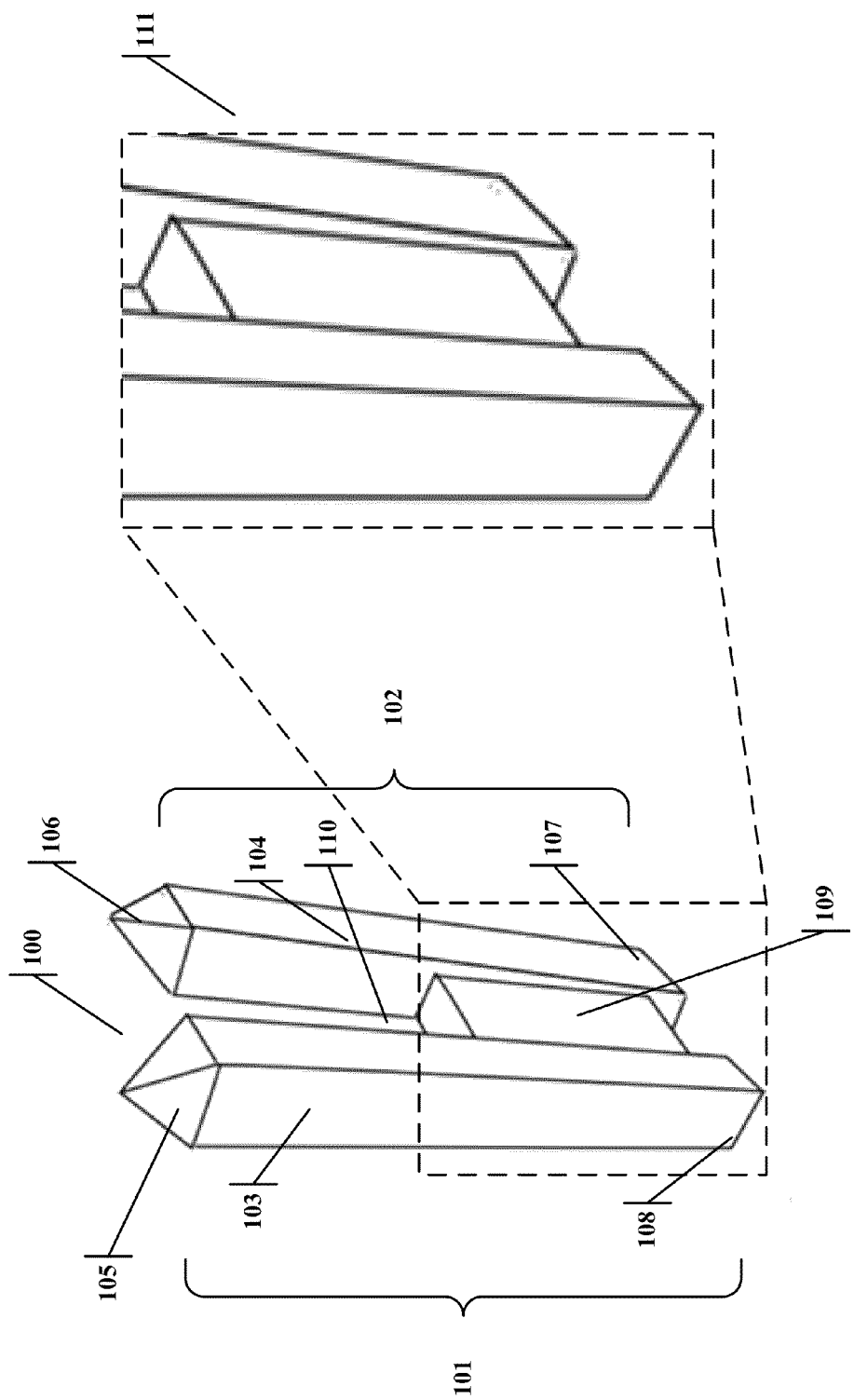

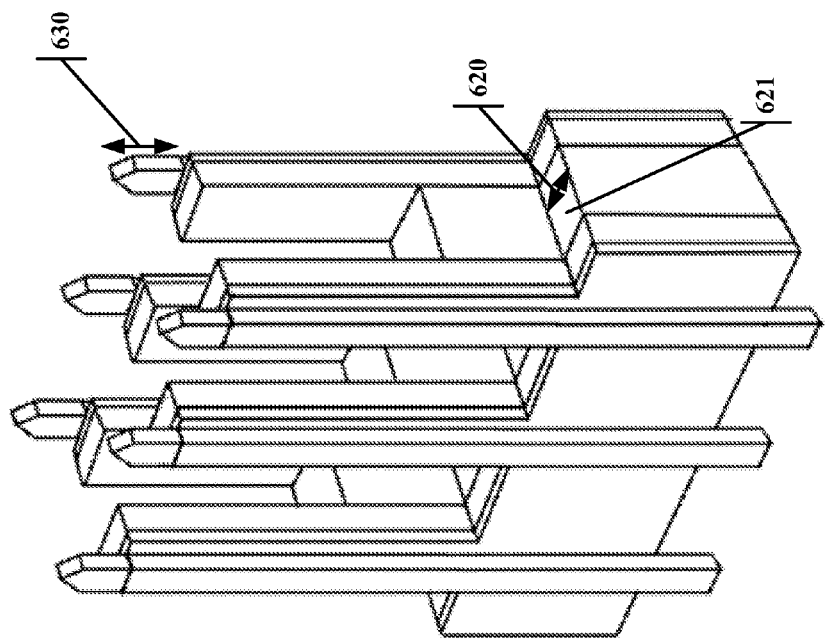
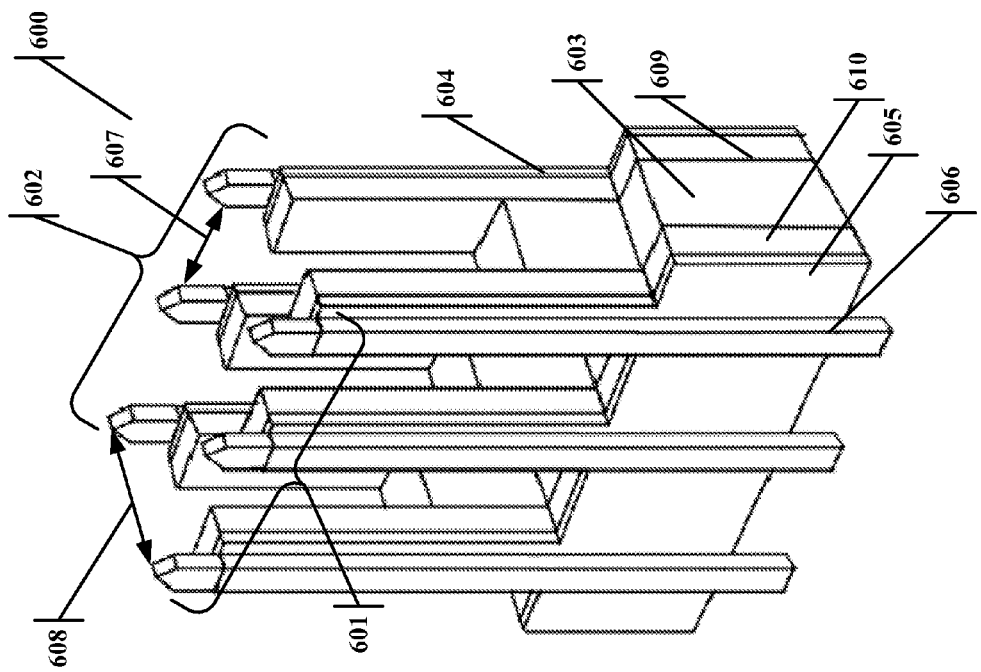
FIG. 6B
FIG. 6A

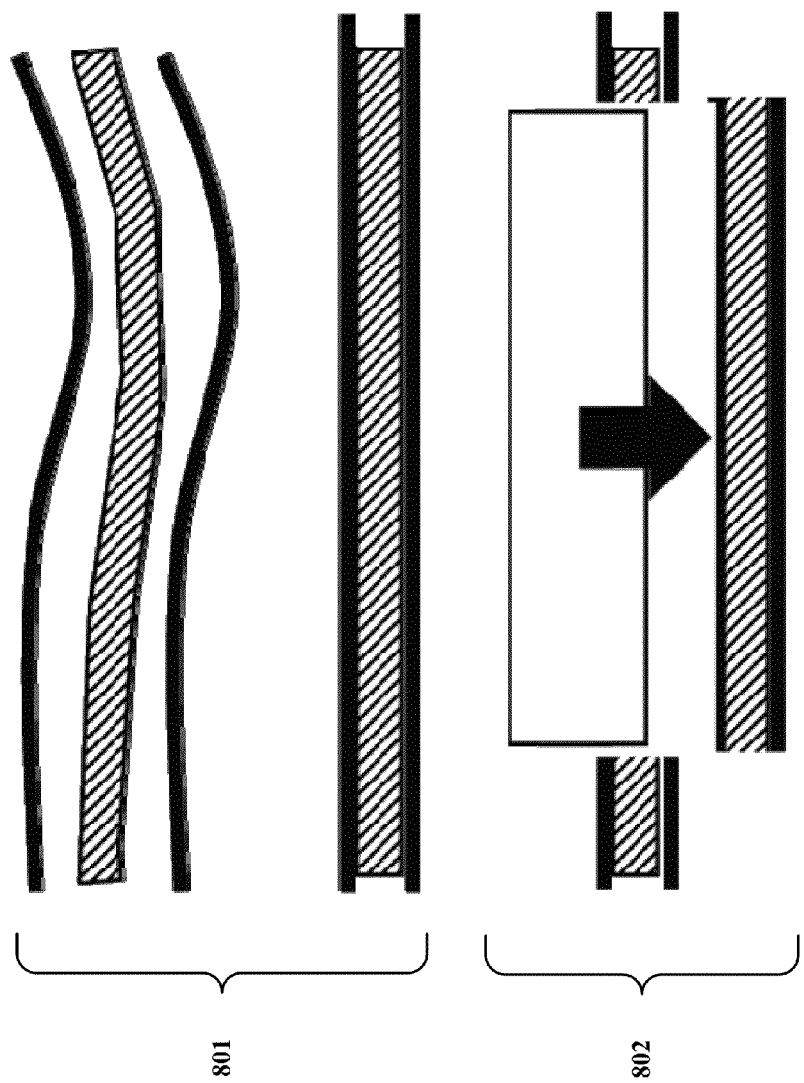

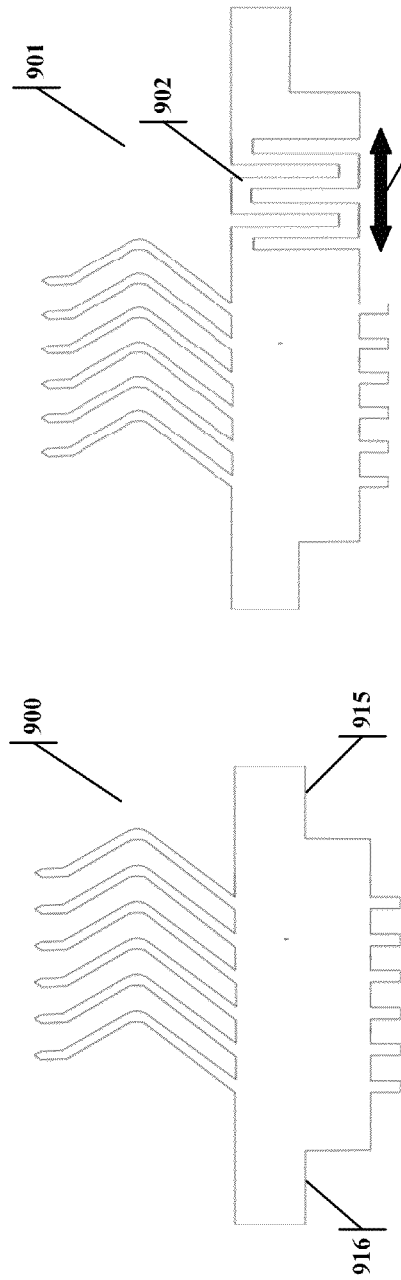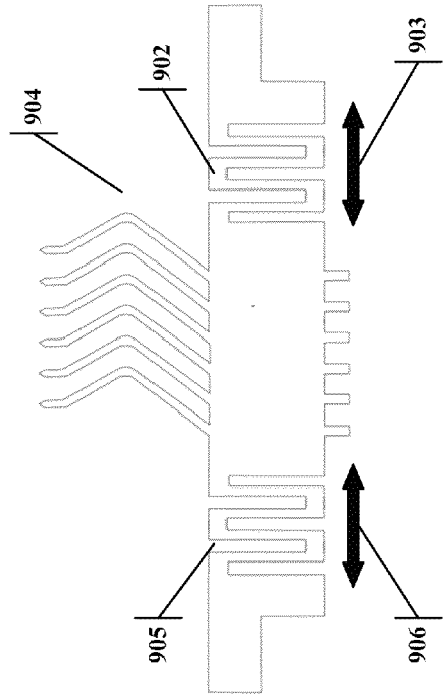
FIG. 9A
FIG. 9B
FIG. 9C

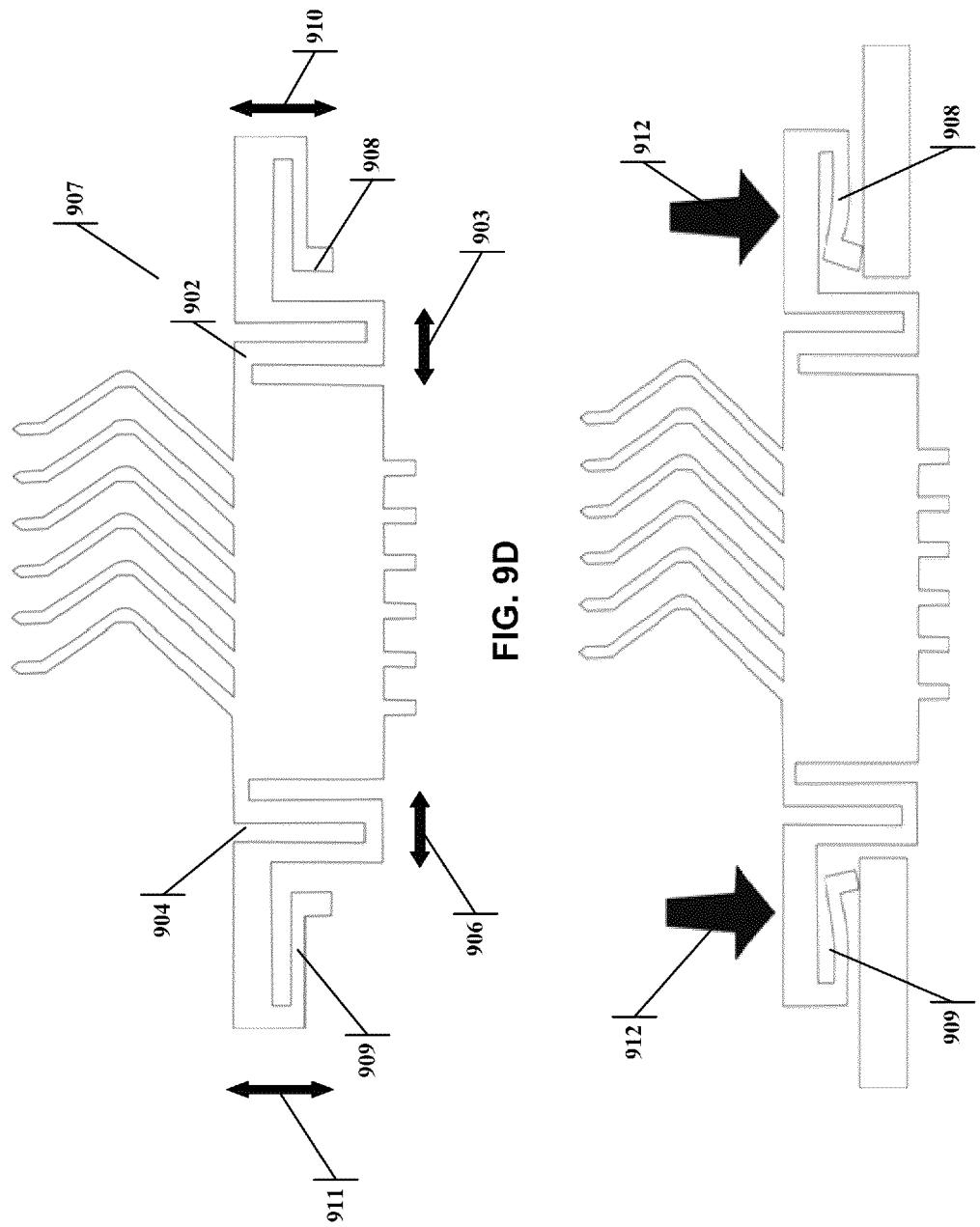

FINE PITCH PROBES FOR SEMICONDUCTOR TESTING, AND A METHOD TO FABRICATE AND ASSEMBLE SAME

CROSS-REFERENCE To RELATED APPLICATIONS

This application claims priority to provisional application No. 60/727,039 filed on Nov. 15, 2012 entitled "Fine Pitch Probes for Semiconductor Testing and a Method to Fabricate and Assemble Same."

FIELD OF THE INVENTION

The apparatus and methods described herein relate generally to fine pitch probes, probe cards, and probe card assembly, repair and inspection for testing semiconductor devices.

BACKGROUND OF THE INVENTION

Integrated circuits are made in a bulk parallel process by patterning and processing semiconductor wafers. Each wafer contains many identical copies of the same integrated circuit referred to as a "die." It may be preferable to test the semiconductor wafers before the die is cut into individual integrated circuits and packaged for sale. If defects are detected the defective die can be culled before wasting resources packaging a defective part. The individual die can also be tested after they have been cut into individual integrated circuits and packaged.

To test a wafer or an individual die—commonly called the device under test or DUT—a probe card is commonly used which comes into contact with the surface of the DUT. The probe card generally contains three unique characteristics: (1) an XY array of individual probes that move in the Z direction to allow contact with the die pad; (2) an electrical interface to connect the card to a circuit test apparatus; and (3) a rigid reference plane defined in such a way that the probe card can be accurately mounted in the proper location. When the probe card is brought in contact with the die pad, the Z-direction movement allows for a solid contact with the probe tip.

The probe card ultimately provides an electrical interface that allows a circuit test apparatus to be temporarily connected to the DUT. This method of die testing is extremely efficient because many die can be tested at the same time. To drive this efficiency even higher, probe card manufactures are making larger probe cards with an ever-increasing numbers of probes.

A number of designs and manufacturing technologies have been developed for the probe card manufacturing industry. One such technology, herein referred to as "single probe pick and place" or "pick and place" for short, has been used for testing semiconductor chips. The typical method of testing using a "pick and place" system involves testing a semiconductor chip on a common holder and using several tens, hundreds and sometimes thousands of individual probes mounted to said holder to test individual pad of the semiconductor chip. For example, one such holder comprises one or more rigid plates with individual holes or cavities, so arranged to mirror the patterns of the electrical pads on the targeted chip or a group of chips. Probes manufactured for pick and place assembly are often called vertical probes, owing the moniker to their probe shank extending substantially perpendicular to the upper surface of the semiconductor chip under test.

U.S. Pat. No. 6,359,454 discloses a pick and place mechanism for assembling a large number of contactors on a contact substrate. The pick and place mechanism includes a first area for positioning an intermediate plate having a plurality of contactors thereon, a second area for positioning the contact substrate for receiving the contactors thereon, a carrier provided between the first and second areas for converting a direction of the contactor to a predetermined direction when receiving the contactor on a seat having an inclined back wall and a flat bottom surface, a first transfer mechanism for picking the contactor from the intermediate plate and placing the contactor on the seat of the carrier, a second transfer mechanism for picking the contactor from the seat of the carrier while maintaining the predetermined direction of the contactor defined by the carrier and placing the contactor on the contact substrate.

Pick and Place methodology substantially prescribes that probes be manipulated one at the time. As pad pitch shrinks, several disadvantages to pick and place can be noted. The handling of ever smaller probes can prove difficult. Furthermore, larger probe counts impacts both manufacturing through-put and cost structures, as the assembly time for each probe head is often proportional to the number of probes required by the end application. Shrinking pitch also requires that the real estate dedicated for each electrical pad shrinks as well, making the insertion of each probe even more difficult. Probe-to-probe positional accuracy might also be impacted because shrinking pitch might require machining tolerances (e.g. machining a hole for a probe) to shrink as well. Developments in pulse-laser machining, for example, may address this point.

Yet another limitation comes from the manufacturing of the probe holder itself. At smaller pad pitches, it becomes incrementally more difficult to machine individual holes, with individual dividers or walls, to effectively separate and insulate one probe from the neighboring probe.

Therefore, Pick and Place could benefit from a technology that facilitates the handling of small probes and, address the manufacturing limitations associated with the fabrication of probe holders while, if possible, cuts down on the number of pick and place operations.

A competing technology to Pick and Place, is "micro-electro-mechanical systems probe technology" (MEMS). MEMS generally refers to a process and sometimes a series of repetitive processes that yield many or all probes necessary to the testing of a chip or set of chips. For the probe card industry, MEMS merely refers to the tools, materials and methods utilized during the manufacturing of the probe(s). MEMS probes are typically fabricated on a common holder. Both the probes and holder are typically assembled along with several other mechanical and electrical parts, not discussed herein, to form a functional probe card. One popular MEMS manufacturing approach is based on the creation of a mold, using photosensitive polymers and photolithographic pattern transfer. In one case, the resulting mold is filled with a metal, using, for example, an electro-deposition process. This process, often followed by an encapsulation step in a temporary filling material and a subsequent lapping step to precisely control the final thickness of the electroplated material, is sometimes repeated, thereby creating as many individual slices or layers as needed to complete a probe capable to deliver both mechanical and electrical performances as designed and required. In its most simple form, the probe substantially resembles a miniature diving board. Its "foot" is anchored to the supporting holder. The other extremity, the "tip," is free to move in space, above the holder, above and below a plane substantially parallel to the upper surface of the semiconductor chip under test. For that reason, MEMS probes are sometimes referred to as horizontal probes, in reference to a vertical probe typically found in a Pick and Place approach.

One advantage of MEMS technologies is that arbitrary numbers of probes of varied geometry can, in theory, be fabricated, all at once, on a common holder. Another aspect of a MEMS approach is that the relative position, both in plane and out of plane, of each probe, and especially the tip, with reference to the semiconductor chip under test can be controlled with extremely high precision, in part thanks to the photolithographic methods employed during fabrication.

Yet, the level of ease, MEMS technologies confer to the manufacturing of probes, is not immune to shrinking pad pitch and ever growing probe-array size. In some cases, shrinking pitch and densely populated probe arrays might reduce the real-estate available for designers and manufacturers to produce individual probes capable of operating both electrically and mechanically to the standards and requirements set for testing the end product. One solution is to build probes that extend vertically, or along an axis orthogonal to the plane defined by the upper surface of the semiconductor chip. Such probes could very well resemble typical "pick and place" vertical probes, i.e. very tall structures, sometimes shaped in a "S" or serpentine fashion. Both aforementioned geometrical attributes are ideal to generate large amount of vertically directed force to contact the electrical pad and/or large amount of vertical motion, to accommodate any source of pad-to-pad non-planarity at the surface of the semiconductor chip. The fabrication of such taller probes using MEMS can however become prohibitively complicated and, in some cases, limited to the processing capability of key ingredients or key manufacturing steps. For example, making very tall probes with MEMS requires several steps because the limitations in the deposition of fine material. Specifically, if the channel (which will become the probe structure) in which fine material is to be deposited is too deep, then the material will not deposit evenly throughout the channel, causes the resulting structure to potentially have voids or weak spots. To remedy this problem, the structure can be constructed in several steps, each building the structure taller. But the problem with this is that the several steps required masking, acid and heat steps, and those steps may be misaligned (causing a non-uniform structure) and the acid/heat steps can cause material fatigue that compromises the integrity of the structure when completed.

The probe head manufacturing industry would benefit from a method that retains some of the most attractive aspects of MEMS, including the possibility to fabricate more than one probe at the time, and combine them with some of the most attractive aspects of "Pick and Place," especially the possibility to manipulate vertical probes, otherwise difficult to fabricate in-situ using MEMS alone. For example, a tall probe structure could be constructed horizontally using MEMS (therefore no problem with fine material deposition) and then pick and placed on a substrate in the vertical position. Such methods exist and have been employed with success to fabricate probe arrays for pitch size as small as ninety micrometers.

U.S. Pat. No. 6,466,043 discloses a contact structure for testing a semiconductor wafer, a packaged LSI or a printed circuit board that is formed on a planar surface of a substrate by aforementioned photolithography technology. The contact structure is formed of a silicon base having an inclined support portion created through an anisotropic etching process, an insulation layer formed on the silicon base and projected from the inclined support, and a conductive layer made of conductive material formed on the insulation layer so that a contact beam is created by the insulation layer and the conductive layer. The contact beam exhibits a spring force in a transversal direction of the contact beam to establish a contact force when the tip of the beam portion pressed against a contact target.

U.S. Pat. No. 6,472,890 discloses another method of producing such a contact structure for electrical communication with a contact target. The method includes the steps of providing a silicon substrate cut in a crystal plane, applying a first photolithography process on an upper surface of the silicon substrate for forming an etch stop layer, forming a first insulation layer on the etch stop layer, forming a second insulation layer on a bottom surface of the silicon substrate, applying a second photolithography process on the second insulation layer for forming an etch window, performing an anisotropic etch on the silicon substrate through the etch window for forming a base portion of a contactor, depositing conductive material on the first insulation layer for forming a conductive layer in a beam shape projected from the base portion, and mounting a plurality of contactors produced in the foregoing steps on a contact substrate in predetermined diagonal directions.

U.S. Pat. No. 6,420,884 discloses another contact structure for testing a semiconductor wafer, a packaged LSI or a printed circuit board that is formed of contact beams and a contact substrate. The contact beam is configured by a silicon base having an inclined support portion created through an anisotropic etching process, an insulation layer having a planar shape and formed on the silicon base and projected from the inclined support, and a conductive layer having a planar shape and made of conductive material formed on one surface of the insulation layer so that a beam portion is created by the insulation layer and the conductive layer. The insulation layer and the conductive layer have substantially the same length. The beam portion exhibits a spring force in a transversal direction of the beam portion to establish a contact force when the tip of the beam portion pressed against a contact target.

U.S. Pat. No. 6,232,669 discloses another contact structure for establishing electrical communication with contact targets with improved contact performance including frequency bandwidth, contact pitch, reliability and cost. The contact structure is formed of a plurality of finger like contactors mounted on a contact substrate. Each of the contactors includes a silicon base having an inclined support portion, an insulation layer formed on the silicon base and projected from the inclined support, and a conductive layer made of conductive material formed on the insulation layer so that a beam portion is created by the insulation layer and the conductive layer, wherein the beam portion exhibits a spring force in a transversal direction of the beam portion to establish a contact force when the tip of the beam portion pressed against a contact target. An adhesive is applied for bonding the contactors to the surface of the contact substrate.

U.S. Pat. No. 6,535,003 discloses another contact structure for electrical connection with a contact target. The contact structure is formed of a contact substrate mounting a plurality of contactors. Each of the contactors is formed of a silicon base having inclined ends, a silicon beam formed on the silicon base having a support end and a contact end, and a conductive layer formed on a top surface of the silicon beam. The support end is slightly projected from the silicon base and the contact end is substantially projected from the silicon base. The contactor is mounted on the contact substrate such that the silicon base and the support end are connected to the surface of the contact substrate through an adhesive, thereby orienting the silicon beam in a predetermined diagonal direction.

U.S. Pat. No. 7,764,152 discloses a probe card having a plurality of silicon finger contactors contacting pads provided on a tested semiconductor wafer and a probe board mounting the plurality of silicon finger contactors on its surface, wherein each silicon finger contactor has a base part on which a step difference is formed, a support part with a rear end side provided at the base part and with a front end side sticking out from the base part, and a conductive part formed on the surface of the support part, each silicon finger contactor mounted on the probe board so that an angle part of the step difference formed on the base part contacts the surface of the probe board.

U.S. Pat. No. 8,097,475 discloses a probe card having a plurality of silicon finger contactors contacting pads provided on a tested semiconductor wafer and a probe board mounting the plurality of silicon finger contactors on its surface, wherein each silicon finger contactor has a base part on which a step difference is formed, a support part with a rear end side provided at the base part and with a front end side sticking out from the base part, and a conductive part formed on the surface of the support part, each silicon finger contactor mounted on the probe board so that an angle part of the step difference formed on the base part contacts the surface of the probe board.

U.S. Pat. No. 8,241,929 discloses a contactor and an associated contact structure, probe card and test apparatus. The contactor may include a base part having three or more steps in a stairway state, a support part with a rear end side provided at the base part and a front end side sticking out from the base part, and a conductive part formed on a surface of the support part and electrically contacting a contact of a device under test.

U.S. Pat. No. 8,237,461 discloses a contactor includes conductive parts for electrical connection with input/output terminals of an IC device; beam parts with the conductive part provided on their main surfaces; and a base part supporting the beam parts in a cantilever manner, the base part has a support region supporting the beam parts and mark formation regions at which first positioning marks are provided, and weakened parts relatively weaker in strength than other parts of the base part are provided between the support region and mark formation regions.

The Applicants hereby disclose a probe design, probe fabrication and a probe head assembly method poised to leverage some of the most attractive aspects of both "Pick and Place" and MEMS, while bridging some of their respective shortcomings. The disclosed probe design combines at least two MEMS probes into one, thereby potentially reducing by a minimum factor of two the number of probes typically handled using "Pick and Place" designs. Also disclosed is an assembly method, based on a reconfigurable probe holder, compatible with "Pick-and-Place" handling operations, yet capable of yielding high probe count, small pitch probe heads with potentially micron to sub-micron positional accuracy, at the pitch of interest.

SUMMARY OF INVENTION

The present application provides a novel apparatus for use in testing semiconductor devices that addresses the shortcomings of the prior art by allowing the probe to bend while maintaining adequate probe to probe positional accuracy during contact with the device under test (DUT). The apparatus includes a plurality of probes, each probe having a shank and a probe tip located at the distal end of the shank, wherein the shank elastically deforms when the probe tip contacts the DUT. The apparatus also has a common foot connected to proximal end of each shank, the foot is capable of elastic deformation when the probe tip contacts the DUT, and a substrate connected to the common foot. A plurality of isolated electrical vertical interconnected access (vias) connect each probe tip to the substrate, such that each probe tip of the plurality is capable of conducting an electrical current from the DUT to the substrate.

The plurality of probes may form a probe comb, and that probe comb may be inserted into a probe comb holder. The probe combs may also have a spring or set of springs that helps maintain the position of the probe comb within the probe comb holder, thus maintain the accurate position of the probe tips located on the probe comb.

Further disclosed is a novel probe comb holder that can receive, and hold the probe combs. The probe combs can be easily inserted into the probe comb holder, and the use of alignment structures can self-align the probe tip into the proper location. The probe comb holder may include a number of plates that slide relative to each other and restrict the movement of the probe comb.

Further disclosed is a method for inserting the probe comb into the probe comb holder, then fixing the probe comb into the probe comb holder. This method can be reversed to remove the probe comb, in case the probe comb is damaged and needs to be replaced.

Other systems, methods, features and advantages of the invention will be or will become apparent to one with skill in the art upon examination of the following figures and detailed description. It is intended that all such additional systems, methods, features and advantages be included within this description, be within the scope of the invention.

BRIEF DESCRIPTION OF THE FIGURES

The forgoing and other aspects, objects, features and advantages of the method and system disclosed will become better understood with reference to the following description, claims, and accompanying drawings, where:

FIG. 1A illustrates two novel probes according to the present invention.

FIG. 1B illustrates the common foot of the two probes of FIG. 1A.

FIG. 6A illustrates a double comb probe design.

FIG. 6B further illustrates the characteristics of a double comb probe design.

FIG. 8A illustrates one process which can be used to manufacture probes.

FIG. 9A illustrates a comb probe without springs.

FIG. 9B illustrates a comb probe with springs only at one end of the comb.

FIG. 9C illustrates a comb probe with springs at both ends of the comb.

FIG. 9D illustrates a comb probe with lateral and vertical springs at both ends of the comb.

FIG. 9E illustrates a comb probe with lateral and vertical springs at both ends of the comb with the comb subjected to a downward force.

DETAILED DESCRIPTION

Figure 1C:
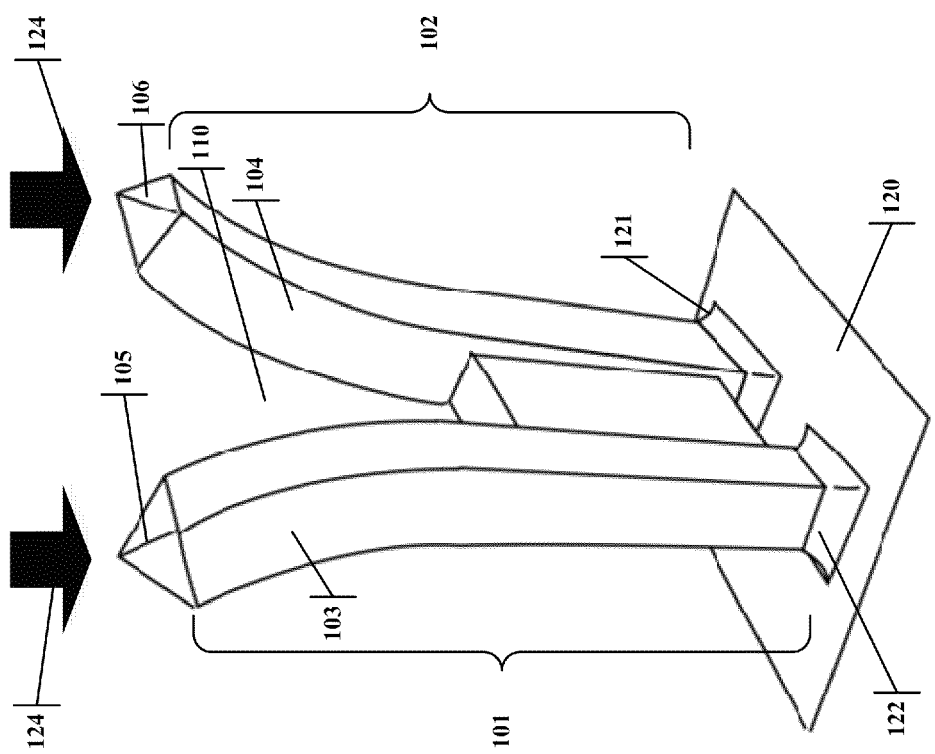
FIG. 1C illustrates the two probes of FIG. 1A affixed at the foot to structure substrate.

Herein is disclosed a probe card design comprising an array or plurality of probes electrically isolated, mechanically joined near the foot, forming a common foot, yet capable of operating mechanically, e.g. bending independently from one another. The following is a list of definitions for terms used in this disclosure:

PROBE: In this application, a probe is a structure which conducts electrical signals from one end, herein referred to as the "foot" to the other end, herein referred to as the "tip" for the purpose of testing semiconductor chips. The tip is typically pressed against the electrical pad of the chip under test. The portion between the tip and the foot is herein referred to as the probe shank.

COMB: In this disclosure, a "comb" will refer to one or more probes co-fabricated, affixed or otherwise mounted on a common mechanical structure. Among other functions, a comb provides a means to handle one or more probes at the same time.

PAD: In this disclosure, a "pad" refers to an electrically conductive portion of a semiconductor chip designed to transmit an electrical current to one or more internal components of the chip. A pad often refers to a square pad of aluminum, the upper surface of a vertical copper pillar used in flip-chip bonding, or a semispherical structure made of any number of soldering alloys. Pads can be arranged in any number of fashions. A grid layout, with center-to-center distance between two pads substantially equal to or bigger than 90 μm is one such possible arrangement. Other possible grid layouts include patchworks of regions at a pitch substantially equal to or larger than 90 μm interleaved with regions with a pitch substantially equal to or smaller than 90 μm, including 65 μm, 50 μm, 45 μm, 40 μm or below. Such interleaved grid layouts will be referred to a "mixed" pitch. The grid elementary cell might be square. It might be rectangular or hexagonal as well.

PROBE CARD: In this disclosure, a "probe card" comprises at least one probe head temporarily or permanently mechanically affixed to at least one structure which provide a means to send and receive electrical signals, from an auxiliary electronics system, including but not limited to a voltmeter and a power supply, all the way to the tip of individual probes, and, for example, elicit an electrical response from the chip under test.

OVERDRIVE: An important probe card performance trait pertains to the probe's ability to elastically deflect or deform in a known and repeatable fashion, when the probe head is pushed against a chip for testing purposes. The amount of motion along a line substantially orthogonal to the plane of the chip under test is referred to as the "overdrive." A "nominal" overdrive refers herein to the overdrive recommended by the designer or the probe manufacturer during typical operations. When forced to bend to nominal overdrive, the probe exerts a reactive force on the electrical pad via the tip. It is commonly assumed that the direction of the force is substantially orthogonal to the surface of the electrical pad.

PROBE TO PROBE MECHANICAL AND ELECTRICAL INTERFERENCE: While bending, various points along the probe shank might move the probe closer to or farther away from other surrounding probes. In some instances, it is important to avoid or control the amount of mechanical or electrical interference that neighboring probes might develop, during testing.

SCRUB MARK: Another important probe card overall trait pertains to the length, depth and width of the scrub mark. A scrub mark is defined as the mark the probe tip leaves at the surface of the chip electrical pad, once the probe head retracts from the chip and the electrical test for that particular chip is finished.

CURRENT CARRYING CAPABILITY or CCC: Another important trait pertains to the probe's ability to carry amounts of current ranging from less than few milliamperes to several amperes. The ability to carry current is herein referred to as the current carrying capability.

REPAIRABILITY: Another important trait pertains to the possibility to repair or replace one or several probes independently from other probes.

TIP PLANARITY: Another important trait pertains to the tip planarity, herein defined as the spatial location above and below a plane substantially parallel to the chip.

TIP LOCATION: Another important trait pertains to the tip location, herein defined as the tip spatial location with reference to the geometrical center of the electrical pads at the surface of the chip under test.

Now turning to the figures, FIG. 1A depicts one such probe array 100, comprising a probes 101 and 102, each of which comprises a shank (103 and 104) with a probe tip (105 and 106) located at the distal end of the shank, and a foot (107 and 108) connected to proximal end of each shank. The shank is capable of elastic deformation when the probe tip contacts a device under test (DUT). The foot (107 and 108) is also capable of elastic deformation when the probe tip contacts the DUT.

As describe below with reference to FIG. 1B, the probe array 100 when used as part of a probe card is affixed to a substrate. The probe also comprises a plurality of isolated electrical vertical interconnected access (vias) connecting the each probe tip to the substrate, such that each probe tip of the plurality is capable of conducting an electrical current from the DUT to the substrate. A physical insulating structure 109, made of electrically non-conductive material, adjoins probe 101 to probe 102. The insulating structure 109 serves both to insure that both probes 101 and 102 are electrically isolated, yet keeps them adjoined so that they can be, at least partially, manipulated as one entity. Free space 110 separates probes 101 and 102 near the distal end. In one particular embodiment, the free space 110 extends down to the middle of the probe shank (103 and 104). A free space 110 separates the feet (107 and 108) of probes (101 and 102). In one example, probes 101 and 102 are made of conductive materials, including but not limited to copper, gold, nickel, nickel manganese, beryllium copper, etc. In another embodiment, probe 101 and probe 102 is made of a single crystal silicon. In one example, tips (105 and 106) can be made of a material substantially similar to the material forming the shank (103 and 104) of either or both probes (101 and 102). In another embodiment, the tips are made of a different material, including but not limited to rhodium. In one embodiment, structure 109 is made of a polymer. In another embodiment, insulating structure 109 is made of electrically non-conductive ceramic, including, but not limited to alumina. In yet another embodiment, structure 109 is made of glass, including but not limited to thermally grown Silicon-dioxide (SiO2).

FIG. 1B illustrates a common foot 111 complex that is comprised of the foot (108 and 107) of each probe (101 and 102), along with the structure 109. As is described below, this common foot 111 can elastically deform when the probe tips come into contact with the DUT and provide part of the compliance of the probe array.

FIG. 1C represents probe array 100 affixed to a substrate 120. Both foot 107 and 108 are affixed to the substrate 120 using a permanent or temporary bonding material 121 and 122. The substrate 120 is a solid (usually planar) substance onto which a layer of another substance is applied, and to which that second substance adheres. In solid-state electronics, this term refers to a thin slice of material such as silicon, silicon dioxide, aluminum oxide, sapphire, germanium, gallium arsenide (GaAs), an alloy of silicon and germanium, or indium phosphide (InP). These serve as the foundation upon which electronic devices such as transistors, diodes, and especially integrated circuits (ICs) are deposited.

In one example, bonding material 121 and 122 is a solder compound, including, but not limited to tin (Sn)-gold (Au) alloys, tin (Sn)-gold (Au)-silver (Ag) alloys, etc. Once probes 101, 102 are anchored to the substrate 120, the forces (represented by the arrows 124 and 125) generated when a semiconductor pad is pressing against probe tips (105 and 106) will cause the probes 101 and probe 102 to deform. Adequate design rules must be used to insure that the stress resulting from the application of a force do not result in plastic deformation, permanent deformation or even destruction of probes 101 and 102. An important aspect pertains to design of the probes 101 and 102 as well as the design of the free space 110. For example, the free space 110 can be designed to extend from the tips 105 and 106 along the shanks (103 and 104). Depending on the design of probes 101 and 102, the size of the free space 110 might dictate how much probe 101 can bend or deform independently from probe 102.

Figures 2A, 2B:
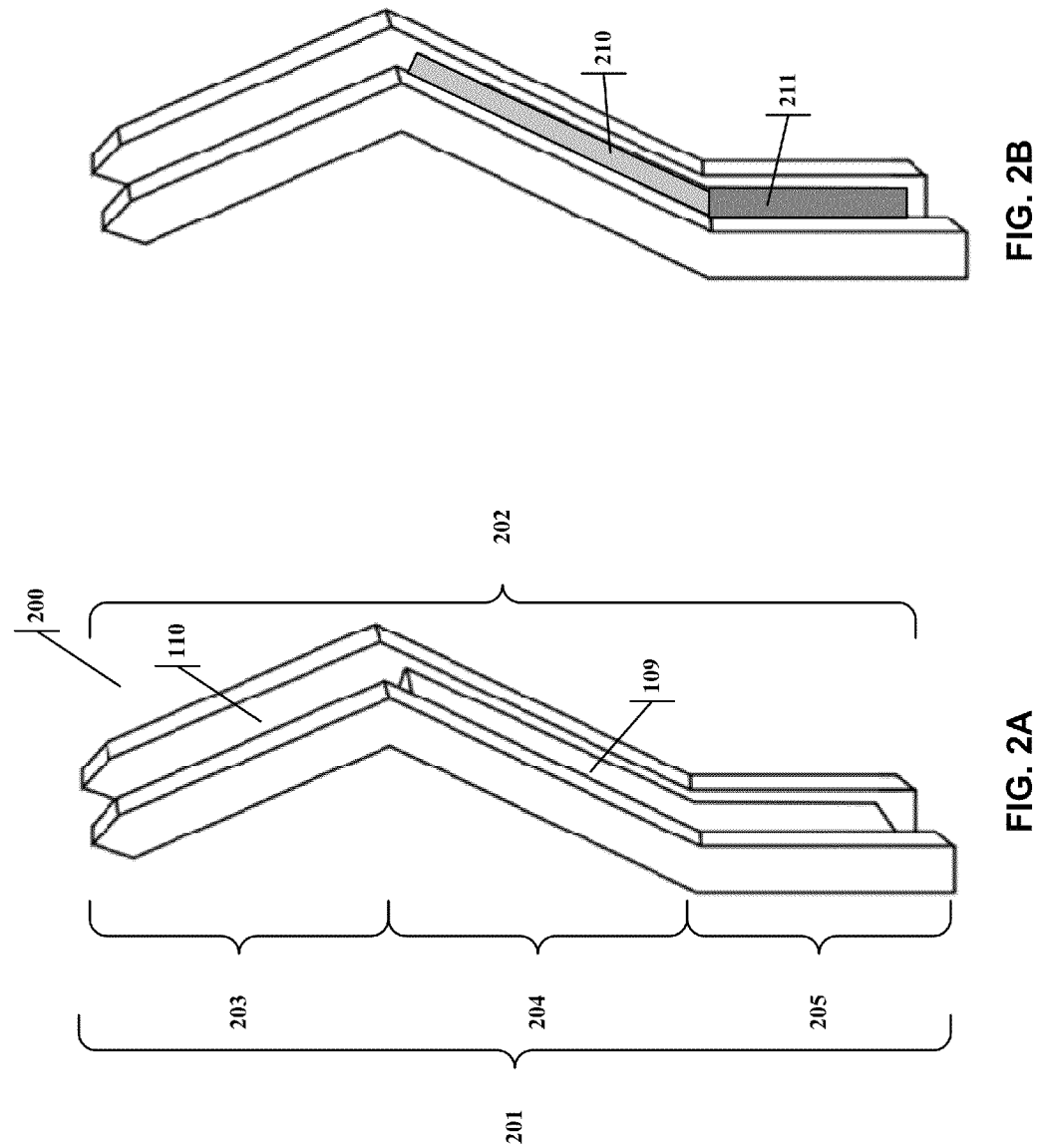
FIG. 2A illustrates another embodiment of two novel probes according to the present invention, with multiple regions with varying stiffness.
FIG. 2B illustrates another embodiment of two novel probes according to the present invention, with multiple regions with varying stiffness.

FIG. 2A is an embodiment of the probe array incorporating two regions of deflection in the common foot. Unlike the probe array 100 describe with respect to FIGS 1A through 1C, here the probe array 200 contains angles within the individual probes 201 and 202. Probes 201 and 202 may be connected to a substrate, although this is not illustrated in FIG. 2A. In the example depicted in FIG. 2A, probes 201, 202 can be subdivided in three distinct sections 203 (upper section), 204 (middle section) and 205 (lower section) delimited by the angles in probes 201 and 202. The upper section 203 represents the part of probes (201 and 202) which are free to move independently, due to the presence of a free space 110 between probes. Section 204 represents a part of probes (201 and 202) where the probes are affixed to one another by insulating structure 109 and are expected to move in unison. In this example, section 205, is also a region where both probes are affixed to the insulating structure 109 and therefore move as one structure. The inherent spring characteristics make section 205 more rigid than both section 203 and section 204. That is, the different sections, or regions, have a different stiffness.

In addition to the angles separating the section, it is also possible to have the insulating structure 109 have two separate regions made up of different materials. This is shown in FIG. 2B, insulating structure 109 has two regions 210 and 211 made up of two different materials, and those materials may each have a different stiffness. The probe array with an insulating material of different stiffness may or may not include the angular bends shown in FIGS. 2A and 2B.

Figure 3:
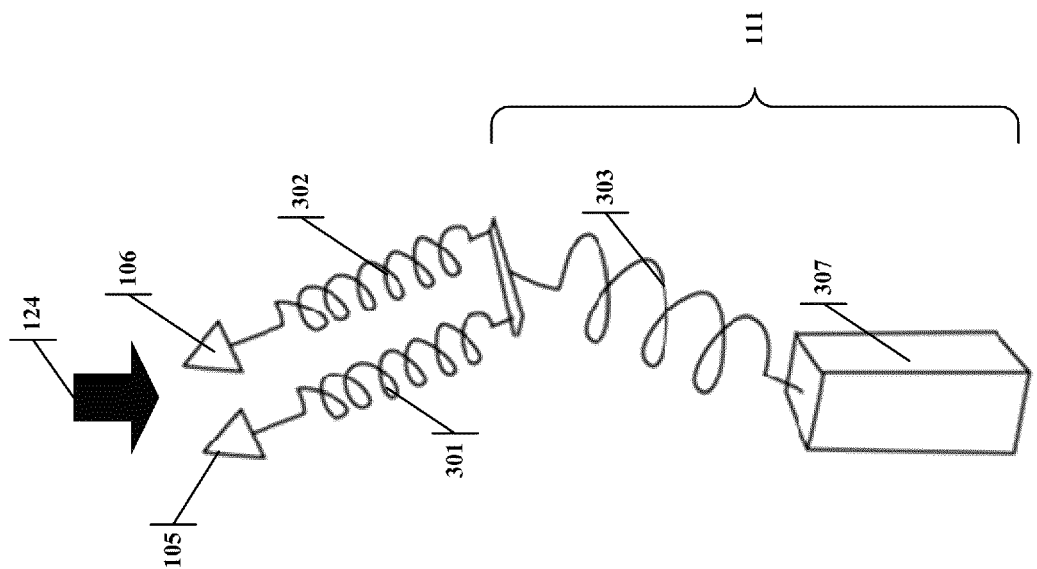
FIG. 3 models two probes as springs to describe the elastic deformation capability of the probes.

Based on the flexible nature of the probes, the system can be modeled as mechanical springs connected either in series or in parallel. This characterization provides more insight regarding the sought after mechanical mode of operation of the probe design herein disclosed. The spring-based representation is depicted in FIG. 3. Section 203 of probe 201 is represented by a spring 301, while section 203 of probe 202 is represent by a spring 302. Section 204 of probes 201 and 202 are physically adjoined and can therefore be represented using a single common spring 303. Both springs 301 and 302 are connected to spring 303. The other end of spring 303 is affixed to structure 307, considered as infinitely rigid in this example. As will be appreciated by those of skill in the art, structure 307 may be designed to less stiff—i.e., more bendable—in which case structure 307 would also be represented by a spring. This design is shown above with respect to FIG. 2B. Also the spring 303 and structure 307 represent/model the common foot 111.

Both free ends of spring 301 and 302 are terminated with a triangle representing tips 105 and 106 respectively. The spatial movement of either tip 105 or 106 can be characterized by the spring model depicted in FIG. 3 with the tip movement a function of the deflection of all three springs. However, it is conceivable that one versed in the art, could design spring 301, 302 and 303 so that a certain levels of forces applied to the free end of one spring alone would not result in any significant movement of the free end of the second spring.

The probe array with a common foot describe herein may be used with cantilever probes, torsional probes and hybrid probes.

Figure 4D:
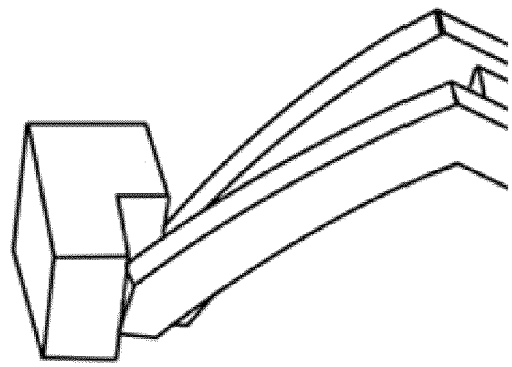
FIGS. 4A-4D illustrates the contact between the probes and the pads of a semiconductor chip under test.
Figure 4C:
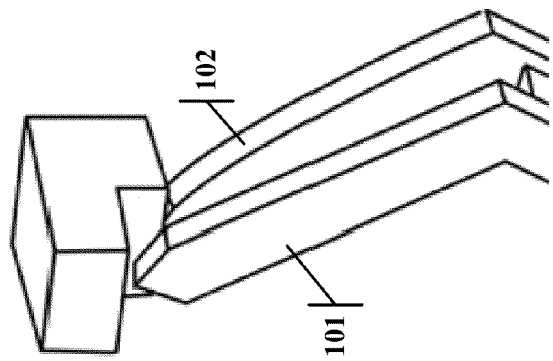
Figure 4B:
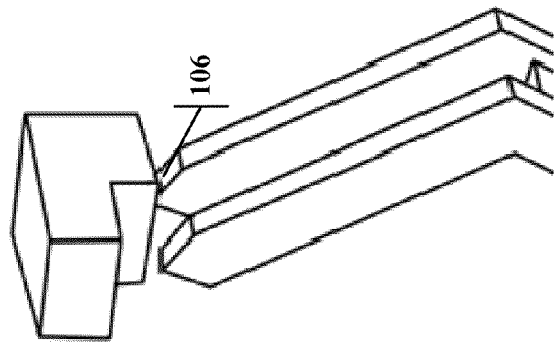
Figure 4A:
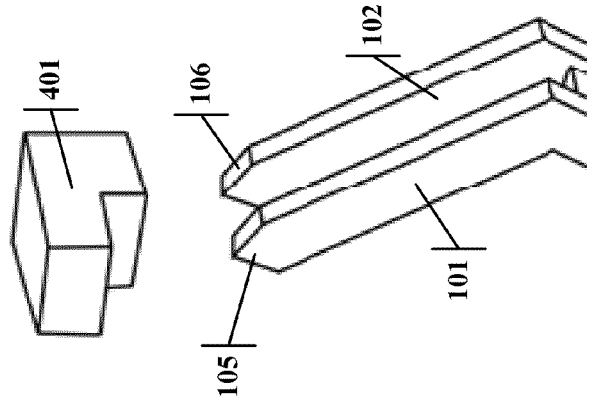

For probe card designs it is desirable to maintain a certain amount of mechanical independence for each probe. Semiconductor chips are typically very flat. Although it is reasonable to expect electrical pads to be coplanar within a few micrometers, debris, missing pads, etc. might contribute to local and sometimes transient or temporary non-planarity. FIG. 4A depicts the tips (105 and 106) of probes (101 and 102) prior to making contact with the semiconductor pads. A local non planarity at the surface of the semiconductor chip is represented by a step structure 401. FIG. 4B illustrates the moment when the step structure first touches one of the tips 106. FIG. 4C illustrates the moment when the step structure 401 has been pushed down by a distance substantially equivalent to 80% of the step height. Note that probe 102 has deflected significantly, while probe 101 has not appreciably deflected. Finally, FIG. 4D illustrates the moment when the step function has moved more than hundred percent of the step height. At this moment, both tips 105 and 106 are making contact with a surface of the step structure 401. The bending characteristics of probes 101, 102 allow for all probes making contact with the semiconductor pads despite the presence of the non-planarity.

Figure 5:
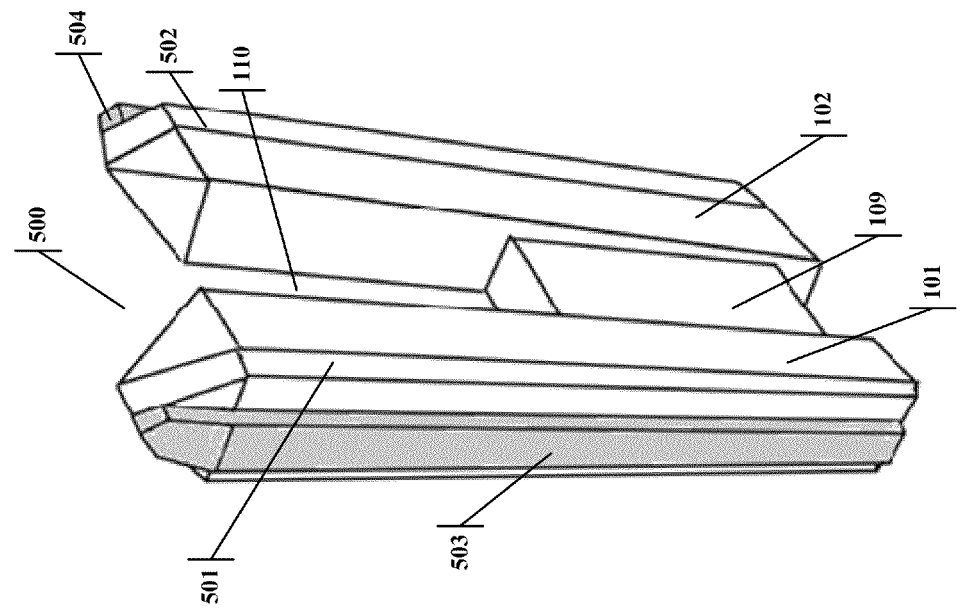
FIG. 5 illustrates a further embodiment of the probes where the conductive layer is deposited, attached, or otherwise affixed to at least one side of the probe.

FIG. 5 depicts a probe array 500, comprising two probes, 101 and 102, made of single crystal silicon. An electrically insulating layer, 501 and 502, is deposited, attached or otherwise affixed to at least one side of probe 101 or probe 102. In one embodiment, insulating layers 501 and 502 can be made of silicon dioxide. The thickness of insulating layer 501 and 502 may range from a fraction of a micrometer to several tens of micrometers, to several millimeters. Conductive lines 503 and 504 are deposited, attached or otherwise affixed to insulating structure 501 and 502 respectively. The mass of the conductive lines may be selected so as to provide compliance to the probe such that the probe can elastically deflect. Probe designers must consider the following aspects of such probe card: mechanical design of both probes 101 and 102, insulating layers 501 and 502, conductive lines 503 and 504, as well as free space 110 and insulating structure 109, in order to guarantee adequate overdrive, force, lateral movement, scrub length of the tip, etc.

FIG. 6A represents an array of probes 600 configured as two banks of parallel probes 601 and 602, each bank, herein referred to as a probe comb, attached by a isolating structure 603, which also serves to join probe combs 601 and 602. It is possible to pair more than two probe combs at a time resulting in an array of probes all in geometric alignment. FIG. 6A represents only one of many possible configurations for probe comb designs, materials, total number of probes, etc. In one embodiment, both probe combs 601 and 602 are made out of Single Crystal Silicon (SCS). In this example, probe combs 601 and 602 are coated with an electrically non-conductive layer 604 and 605. The layers (604 and 605) are affixed to a probe comb scaffold (609 and 610), one for each probe comb, said scaffold is preferably non-conductive. Electrical conductive lines 606 (i.e. vias) are affixed, mounted or otherwise attached to the non-conductive layer. Insulating structure 603 may be made from silicon dioxide, and adjoin the scaffold (609 and 610). Arrow 607 represents the average distance between the probe tips, affixed on a same probe comb. Arrow 608 represents the minimum distance between probe tips from separate probe combs. When considering a hypothetical application targeting a pitch arbitrarily set to 50 μm in the following example, it follows that the distance 607 and 608, between neighboring tips shall be substantially equal to 50 μm. Distance 608 may be designed to be the sum of: half of the thickness of the probe tip, the thickness of electrically nonconductive layer (605), the thickness of probe comb scaffold (610), the thickness of insulating structure (603), the thickness of probe comb scaffold (609), the thickness of nonconductive layer (604) and half the thickness of the probe tip. In one configuration, the tip thickness is four (4) micrometers, the nonconductive layer thickness is one (1) micrometer, the probe comb thickness is twenty (20) micrometers, the insulating structure thickness is two (2) micrometers, the second probe comb thickness is twenty (20) micrometers, the second nonconductive layer is one (1) micrometer, and the second tip is also four (4) micrometers.

FIG. 6B further illustrates the combined probe comb structure of FIG. 6A. Distance 620 represents the extent to which the shoulder 621 protrudes on either side of probe comb 601 or 602. Distance 620 can vary from zero to several tens of millimeters. Distance 630 represents the average distance to which tips, extends beyond the free end of one fingers of the probe comb scaffold. Distance 630 can vary from a zero to several millimeters, if necessary.

Although FIGS. 6A and 6B represent probe combs with individual probes substantially aligned and identical in size and structure, it is important to note that this design is also applicable to probe combs with non-symmetric probes. An important aspect pertains to the manufacturing of such double probe combs and will be described in the later in the disclosure.

Figure 7:
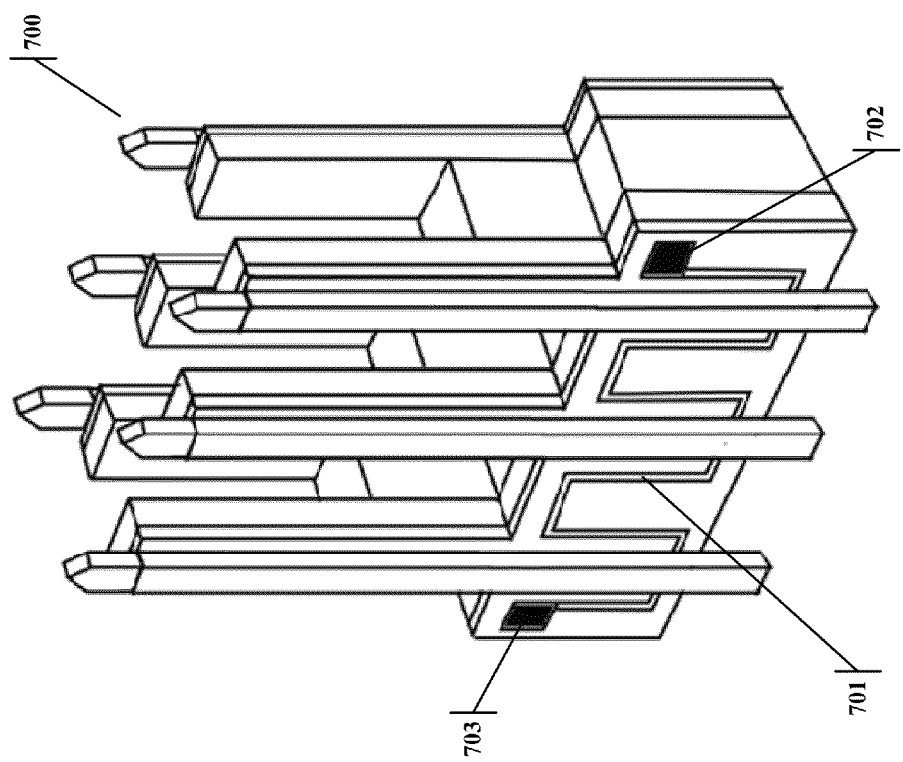
FIG. 7 illustrates a double comb probe design with electronic circuitry.

Electrical elements, including but not limited to resistors, inductors, thermocouples, or resistive heaters can be incorporated, affixed or otherwise added to one or both probe combs. FIG. 7 depicts one such case, where a double probe comb 700, similar to double probe comb 600 from FIG. 6A or 6B, is fitted with a resistive heaters, made of, for example, a thin film of nickel properly patterned and dimensioned to result, for example, in a meandering structure 701, terminated by two larger areas 702, 703 made of the same metal. Under specific levels of current determined by one skilled in the art, current allowed to flow between areas 702 and area 703, via meandering structure 701 generates heat and maintains or raises the temperature of probe comb 700. This feature could, for example, be used in conjunction with a solder reflow process, to anchor probe comb 700 to a substrate, not represented in FIG. 7.

Figure 8D:
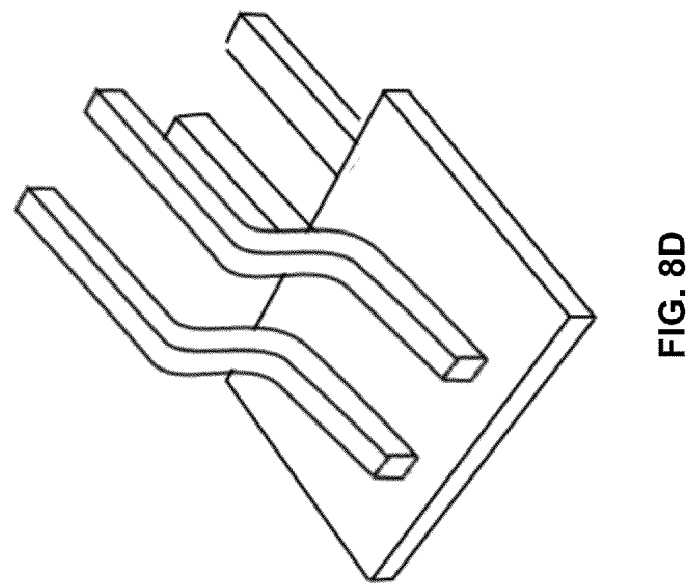
FIG. 8D illustrates a probe design where conductor lines partially release from alumina substrate.
Figure 8C:
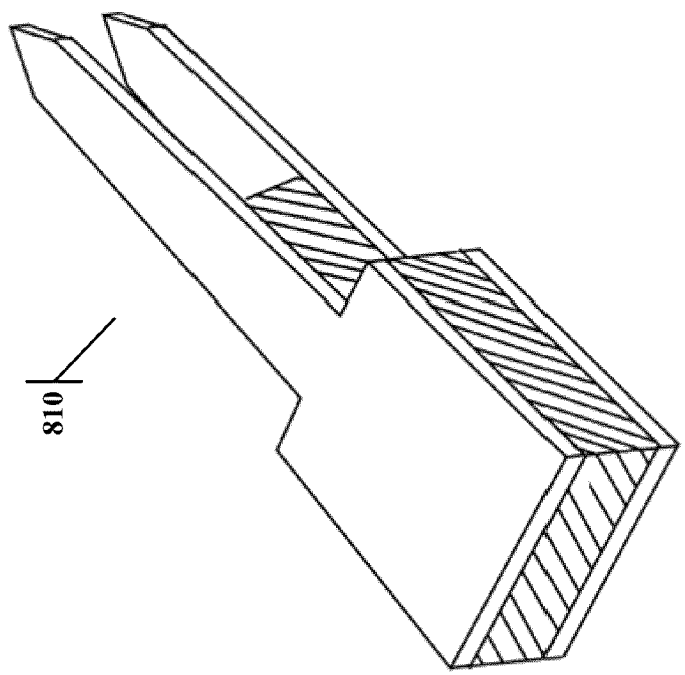
FIG. 8C illustrates a probe cut-out following the etching process.
Figure 8B:
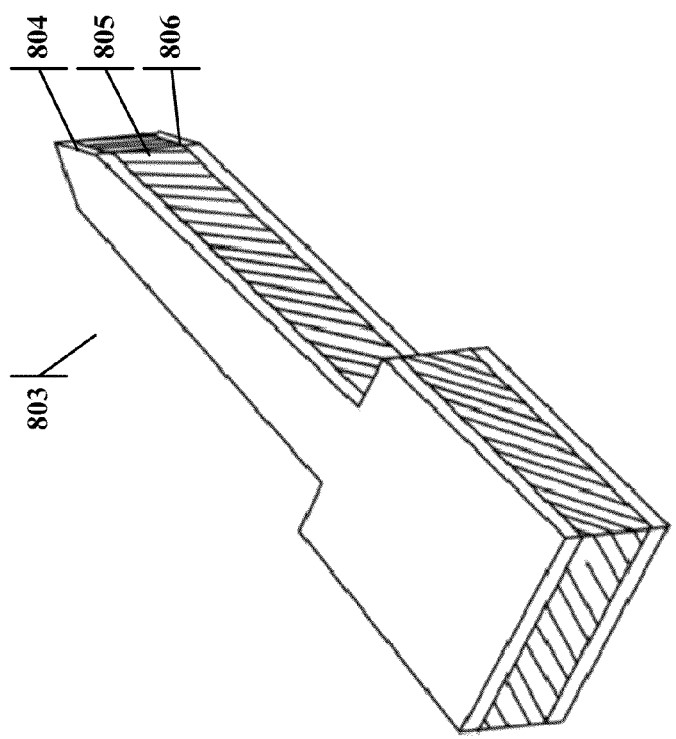
FIG. 8B illustrates a probe cut-out from following the stamping process.

An important aspect pertains to the manufacturing or the techniques employed to fabricate a probe composed of two probes, akin to probe array 100, or a series of probes, akin to probe array 700. A number of techniques can be used to manufacture these arrays. One possible fabrication process is described in FIGS. 8A through 8C. The first step 801 represents the action of laminating, i.e., pressing with the intent to create a strong, durable mechanical bond, two foils of Beryllium Copper to a foil of polyimide. The permanent bond can be obtained using, for example, a thin layer of adhesive material. Once laminated, the three-layer part is subjected to a stamping process, annotated 802, i.e., a process during which a small portion of the three layer part is cut out, using a stamp or a die of arbitrary shape. Structure 803 is an example of a cut out resulting from the aforementioned stamping step. Structure 803 bears resemblances with sought after structure 100 from FIG. 1, with some exceptions, including the absence of a negative space between two of the three layers 804, 805, 806. If necessary, a localized etching process can be applied and so directed as to partially remove layer 805. Structure 810 is one embodiment of the resulting structure following the etching process.

Structure 810 can be fabricated using a flex circuit and front and back micromachining, to pattern conductor lines. Structure 810 can also be fabricated using alumina substrate in conjunction with a front and back micromachining to pattern conductor lines. In one embodiment, the conductor lines are fabricated using a mechanically resilient material, including but not limited to Nickel-Manganese (NiMn), Nickel-Iron (NiFe), Nickel-Cobalt (NiCo), etc. In one embodiment illustrated in FIG. 8D, the conductor lines are partially released from the alumina substrate, to allow the conductor line to act as a mechanical spring.

In another embodiment, the probe combs can be equipped with mechanical springs on one, either, or both ends of the probe comb. FIG. 9A represents a probe comb 900 without springs, but with shoulders 915 and 916. The purpose of these shoulders will be described below. FIG. 9B represents a probe comb 901, comprising a probe comb with a spring 902 on one end only. Spring 902 allows for compliance in the direction of arrow 903. FIG. 9C represents such a similar structure 904 with two springs 902 and 905, allowing for compliance in the direction of arrows 903 and 906 respectively. FIG. 9D represents a structure 907 similar to probe comb 901, with additional springs 908 and 909 attached to both shoulders and that can operate in a direction substantially perpendicular to either springs 902 or 904, allowing for compliance in the direction of arrows 910 and 911. FIG. 9E represents probe comb 907 subjected to a downward force 912, forcing spring 908 and 909 to bend and deform. The amount of deformation is a function of the spring constant of springs 908 and 909 and the downward force 912.

The purpose of mechanical springs 902 and 904 will become apparent, as the disclosure now focuses on a means to group and arrange more than one probe comb to form a complete probe card. It is understood that most modern probe cards comprise up to several thousands of probes.

Figure 10A:
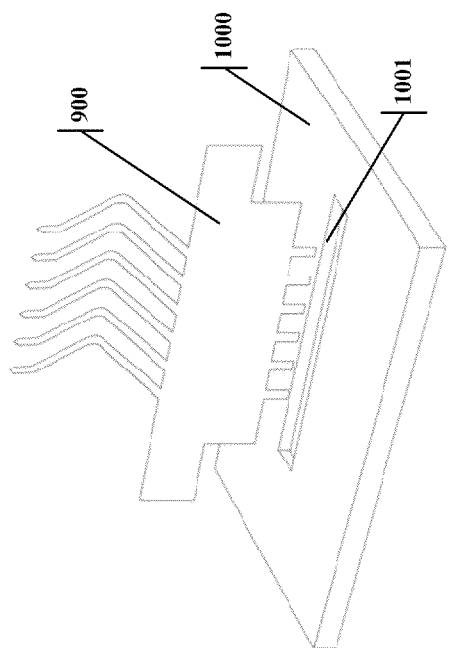
FIG. 10A illustrates a plate with a slot configured to accept a portion of a probe comb.
Figure 10B:
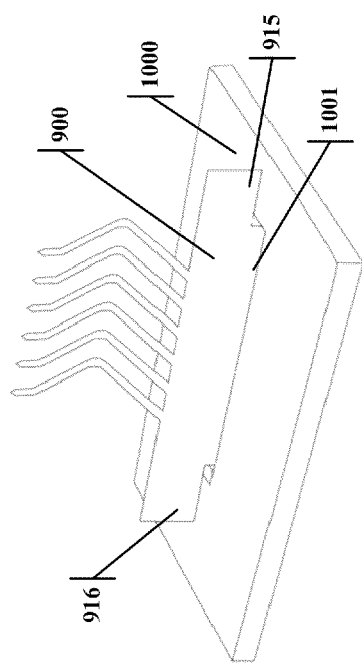
FIG. 10B illustrates a plate with a probe comb inserted into the slot on the plate.

In one example, a plate with well-defined electrical, mechanical and geometrical attributes, including thickness, type of material, etc. is so machined to create a series of grooves, wide enough to accommodate the insertion of a predetermined portion of a probe comb. FIG. 10A represents such a plate 1000, as well as a probe comb 900, just prior to probe comb 900 being placed within slot 1001. FIG. 10B represents the plate 1000 and probe comb 900 at the end of the assembly step, at which point probe comb 900 is partially inserted within slot 1001. Shoulders 915 and 916, on both sides of probe comb 900 limit the progress of probe comb 900 though slot 1001.

Figure 11:
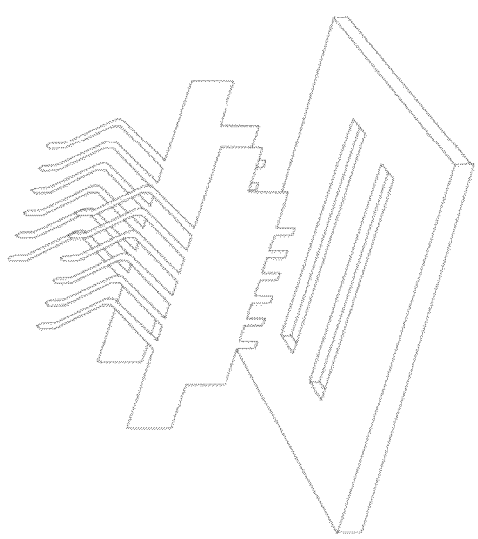
FIG. 11 illustrates a plate with a plurality of slots configured to accept a portion of a plurality of probe combs.

FIG. 11 illustrates a plate with two slots. Each slot is designed to receive an individual probe comb. By extension, using this method, plates with arbitrary numbers of slots can be fabricated, leading to the assembly and collocation of a number of probe combs equivalent or smaller than the number of slots available on the plate. It should also be apparent that multiple probe combs can be placed within a single slot.

Figure 12:
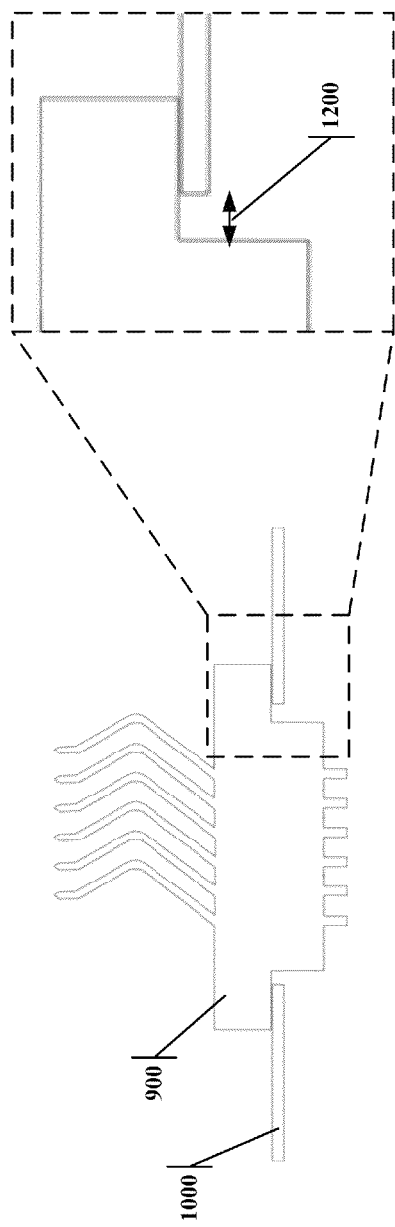
FIG. 12 illustrates a side cut-away view of a probe comb inserted into a slot on a plate.

FIG. 12 represents a both probe comb 900 and a plate 1000 in cross section view. Distance 1200 represents the amount of play, i.e. the difference between the width of probe comb 900 and the width of slot 1001. A certain amount of play is necessary to allow for probe comb 900 to be inserted in slot 1001. It is understood that a larger value of play will make it easier for inserting the probe comb 900 into a slot 1001.

Too much play, however, can prove detrimental to probe alignment and probe stability. In one case, too much play might hinder the precise alignment of one probe comb with reference to its neighbors, in the event that more than one probe comb is to be assembled on a single plate. Too much play might also allow any given probe comb to move within a slot and, under the right set of circumstances, get dislodged, unless otherwise affixed to the plate, after the probe comb has been inserted.

Figure 13A:
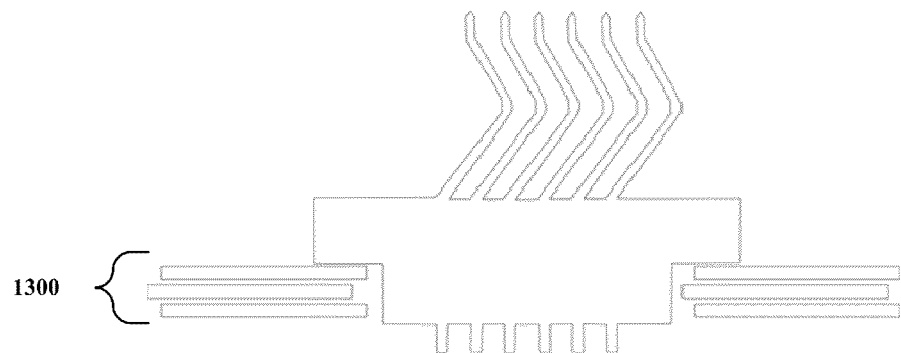
FIG. 13A illustrates a side cut-away view of a probe comb inserted into a probe comb holder that comprises three plates.
Figure 13B:
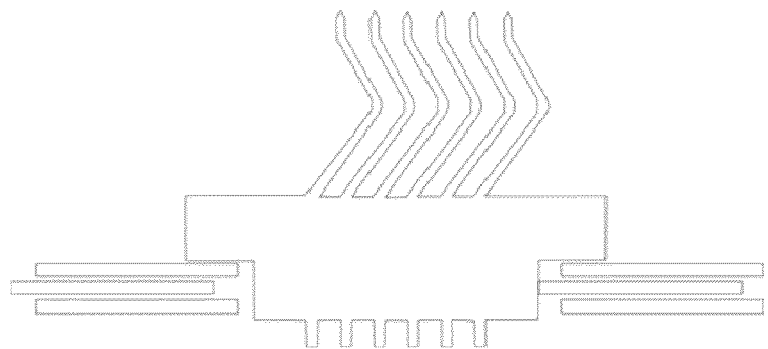
FIG. 13B illustrates a side cut-away view of a probe comb inserted into a probe comb holder, where one of the plates is used to align the probe combs.
Figure 13C:
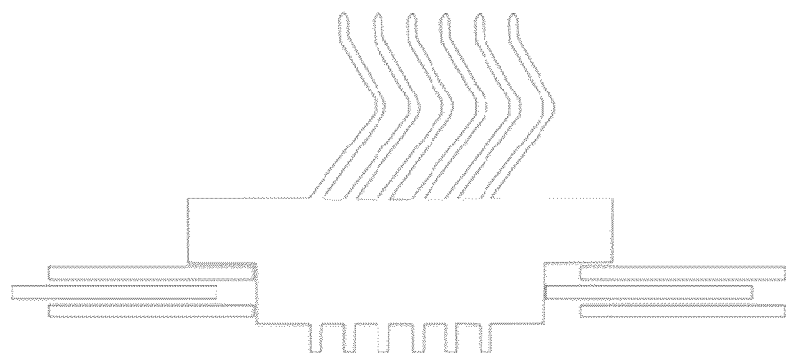
FIG. 13C illustrates a side cut-away view of a probe comb inserted into a probe comb holder, where three of the plates are used to align the probe combs.

The present application discloses a plate or, in more general terms, a probe comb holding system that (a) facilitates the placement of individual probe combs, (b) can host an arbitrary number of probe combs, (c) can insure an adequate degree of probe comb-to-probe comb positional accuracy. FIG. 13A and 13B offer a cross-sectional representation of such a probe comb holder 1300, comprised of three plates vertically stacked on top of each other. Although not depicted in detail in FIG. 13, it is to be understood that at least one plate can move independently from the other two plates. FIG. 13A illustrates the state of the probe comb holder 1300 when a single probe comb is inserted all the way into a slot. At that time, the probe comb is substantially free to move within the allotted slot. FIG. 13B illustrates the moment when one of the three plates has been pushed laterally along the direction of the long edge of the plate, until one edge of the plate slot mechanically engages with the probe comb(s). FIG. 13C represent the state of the probe comb holder 1300 after the other side of the probe comb has been pushed laterally against the two other plates. At that moment, the probe comb freedom to move laterally within the slot is restricted.

Figure 14:
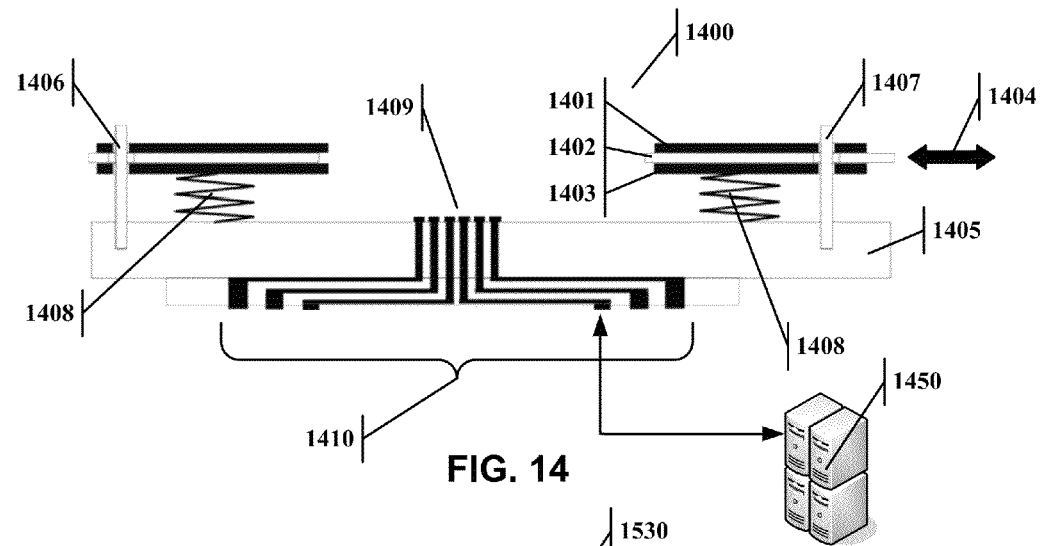
FIG. 14 illustrates a probe comb holder which allows probe comb motion in a vertical direction.

In the event that more that more than one probe comb are assembled, and assuming that the play between each probe comb and their respective slot is perfectly controlled, the steps described in FIGS. 13A, B and C will result in precisely aligning all probe combs at once. It is however reasonable to expect that the dimensions and key geometrical attributes might vary from one probe comb to another. Slots and probe combs might suffer from such variability, arising, for example, from tolerances any given machining or micromachining method might afford. It is therefore an object to disclose a probe comb and a probe comb holder that helps accommodate such dimensional variability and participate to produce a complete probe comb holder that exhibits all in-plane positional features, as prescribed by the end application. FIG. 14 represents one such solution for a probe comb holder 1400.

In one embodiment as depicted in FIG. 14, probe comb holder 1400 comprises three holding plates 1401, 1402 and 1403. One plate, plate 1402, is so machined to allow a certain amount of play and movement, independent from the two other plates. This play, or movement, is represented by the double arrow 1404. All three plates are mechanically aligned with reference to plate 1405 using a plurality of alignment pins 1406 and 1407. Mechanical springs 1408, comprising, but not limited to, helical stainless steel coils or parallelepipeds of compliant material, such as rubber, are inserted between plate 1403 and plate 1405. The play between alignment pin 1406 and 1407 and plate 1402 is larger than the play between both aforementioned pins and the other two plates 1401 and 1403, conferring plate 1402 with a greater range of in lateral plate motion, relative to plate 1405, when compared with that of plates 1401 and 1403.

Plate 1405 is equipped with an electrical structure comprising a series of electrical pads 1409 on one side, and several layers of metal and insulators 1410, designed to redistribute or fan out the electrical connecting terminals on the bottom side of plate 1405. These electrical connecting terminals may be connected to diagnostic equipment 1450, thereby providing the diagnostic equipment 1450 an electrical connection to the DUT. At this point, the diagnostic equipment 1450 may run test on the DUT to determine if the DUT is operating properly.

In one embodiment, plates 1405, 1401, 1402 and 1403 are made of single crystal silicon. In another embodiment, all aforementioned plates are subjected to a series of etching and deposition steps, congruent with those routinely used for the fabrication of MEMS and semiconductor structures.

Figure 15:
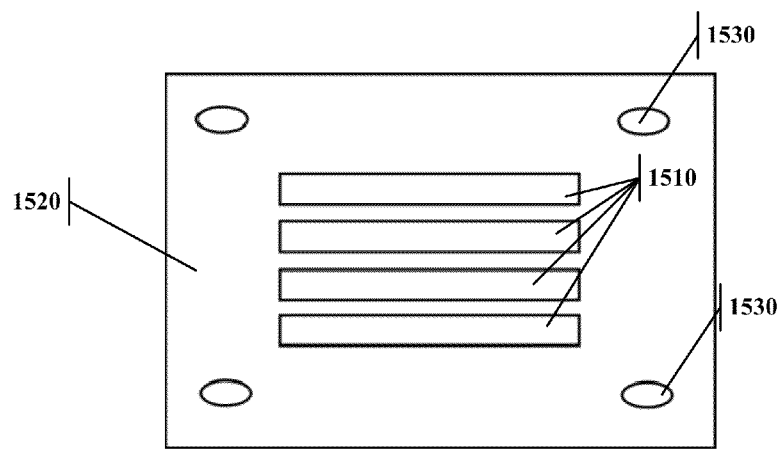
FIG. 15 illustrates a planar surface of the probe comb holder with a plurality of slots etched into the surface.
Figure 16:
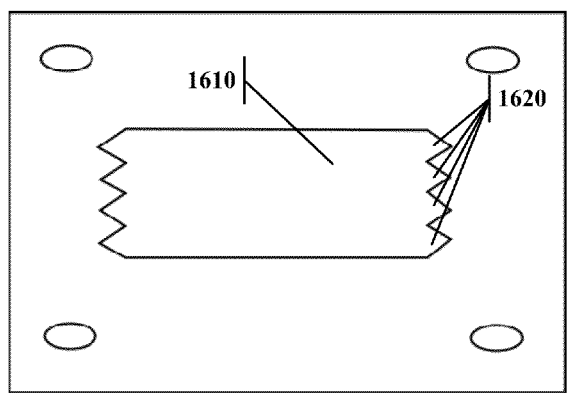
FIG. 16 illustrates a planar surface of the probe comb holder with a plurality of slots etched into the surface where each slot is flanked by a series of triangular cuts.

In one embodiment, plates 1401, 1402 and 1403 have individual slots for each individual probe comb. FIG. 15 illustrates an example of a series of slots that may be etched into these plates. Specifically, FIG. 15 illustrate slots 1510 etched into a plate 1520, along with holes 1530 that may accept alignment pins 1406 and 1407. In another embodiment illustrated in FIG. 16, plates 1401, 1402 and 1403 have a single opening 1610 flanked by a series of triangular cuts 1620. Into each of these triangular cuts a single probe comb may be ultimately disposed, such that slot 1610 can accommodate four probe combs. These triangular cuts form a self alignment structure that self-align the probe comb such that when the probe comb is fixed to the probe comb holder the probe tips are aligned in their proper position.

Figure 17A:
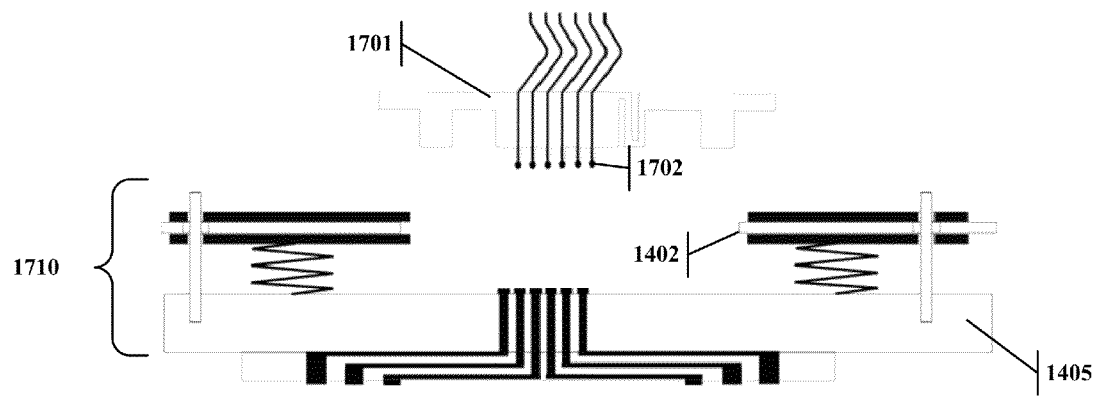
FIGS. 17A-17E illustrate a side cut-out view of the insertion of a probe comb into a probe comb holder.
Figure 17B:
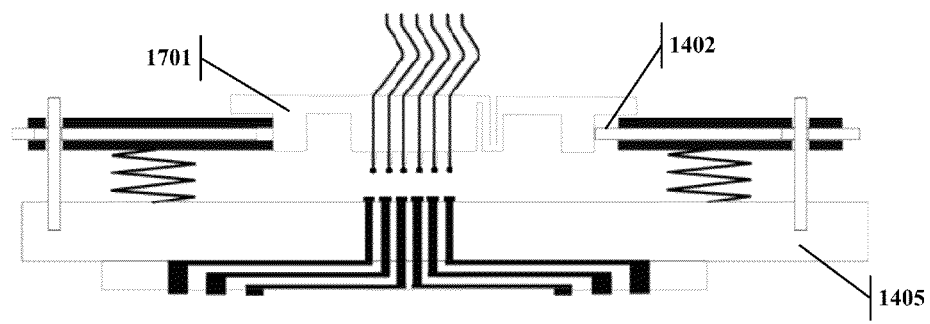
Figure 17C:
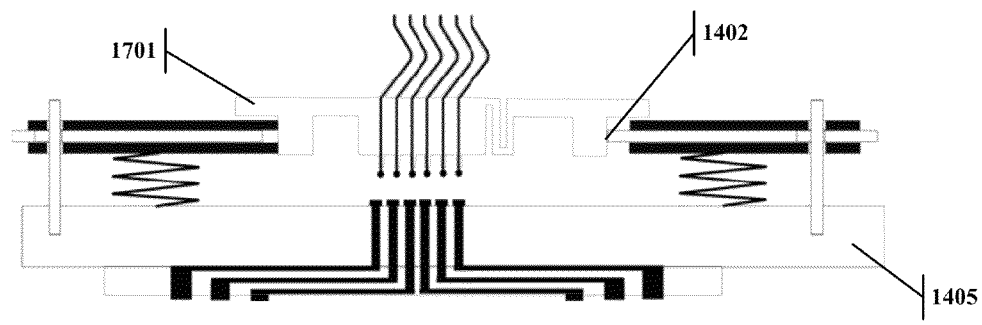
Figure 17D:
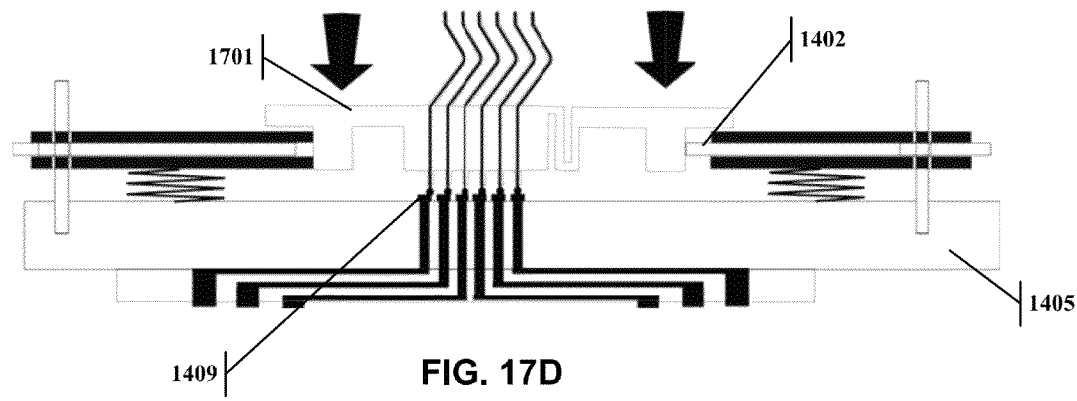
Figure 17E:
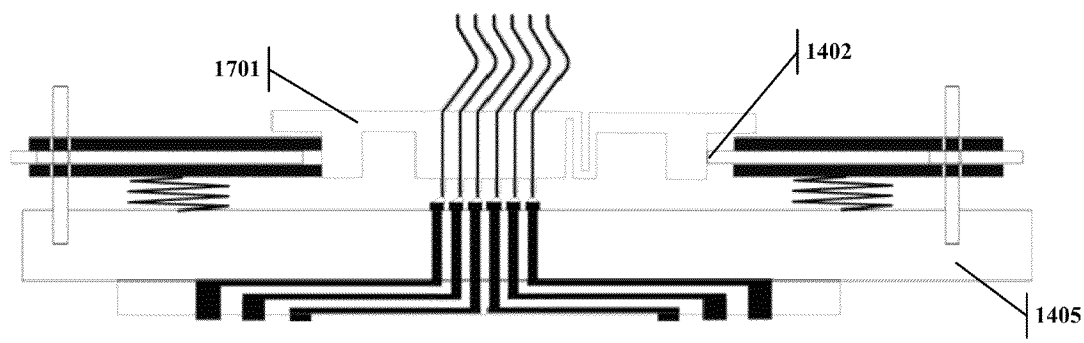

FIGS. 17A, 17B, 17C, 17D and 17E represent the insertion of a probe comb 1701 into the probe comb holder 1710. These figures illustrate the process of the mechanical insertion of a probe comb 1701 (FIGS. 17A and 17B), the sliding of plate 1402 to adjust the position of probe comb 1701 with reference to plate 1405 (FIG. 17C), the application of a downward force to bring the bottom part of probe comb 1701 in contact with the electrical pads 1409 on plate 1405 (FIG. 17D) and finally a thermal treatment that results in permanently affixing, both electrically and mechanically, probe comb 1701 to plate 1405 (FIG. 17E).

In one example, probe comb 1701 comprises two series of springs, several layers of insulating and conducting materials to substantially mimic the mechanical and electrical structure of probe comb 600, described earlier. In one embodiment probe comb 1701 comprises solder balls or solder-coated electrical terminals 1702 as depicted in FIG. 17A.

Figure 18:
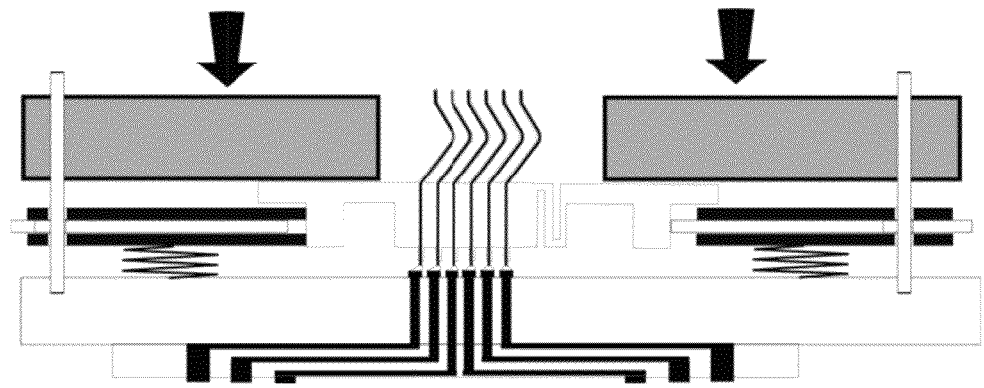
FIG. 18 illustrates a side cut-view of an aligned probe comb inserted into a probe comb holder where downward force is applied to make electrical contact between the probe comb and an array of electrical pads on the probe comb holder.

Forces can be applied directly to the probe comb, away from the probe shank. Alternatively as illustrated in FIG. 18, a separate plate can be temporarily aligned, using the alignment pins, and downward pressure applied against the springs.

Figure 19:
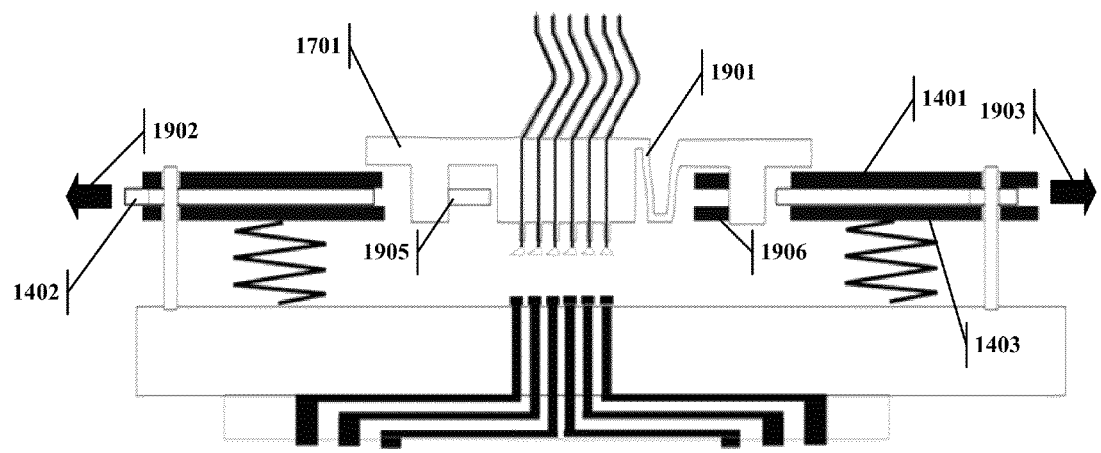
FIG. 19 illustrates a side cut-view of an aligned probe comb inserted into a probe comb holder where downward force is applied to make electrical contact between the probe comb and an array of electrical pads on the probe comb holder, where the top plate is pulled rather than being pushed to avoid bowing or buckling of the probe combs.

In another example, probe comb 1701 is pulled vertically down, rather than being pushed, by plate 1402, to make electrical contact between the probe comb pins and the plate 1405. This method offers the advantage to apply a certain amount of tensile forces on probe comb 1701 (as well as any other probe comb co-assembled in the same probe comb holder), thereby any bow or buckling is avoided. An example of a plate designed to pull rather than push on a probe comb is represented in FIG. 19. Spring 1901, integrated along with probe comb 1701, is pulled and deformed as a result of tensile forces 1902 is applied to plate 1402 and force 1903 is applied in the opposite directly to both plates 1401 and 1403. It should be noted that plate 1402 hooks around the probe comb 1701 at position 1905, and plates 1401 and 1403 hook at position 1906, enabling the plates to exert tensile force.

Figure 20:
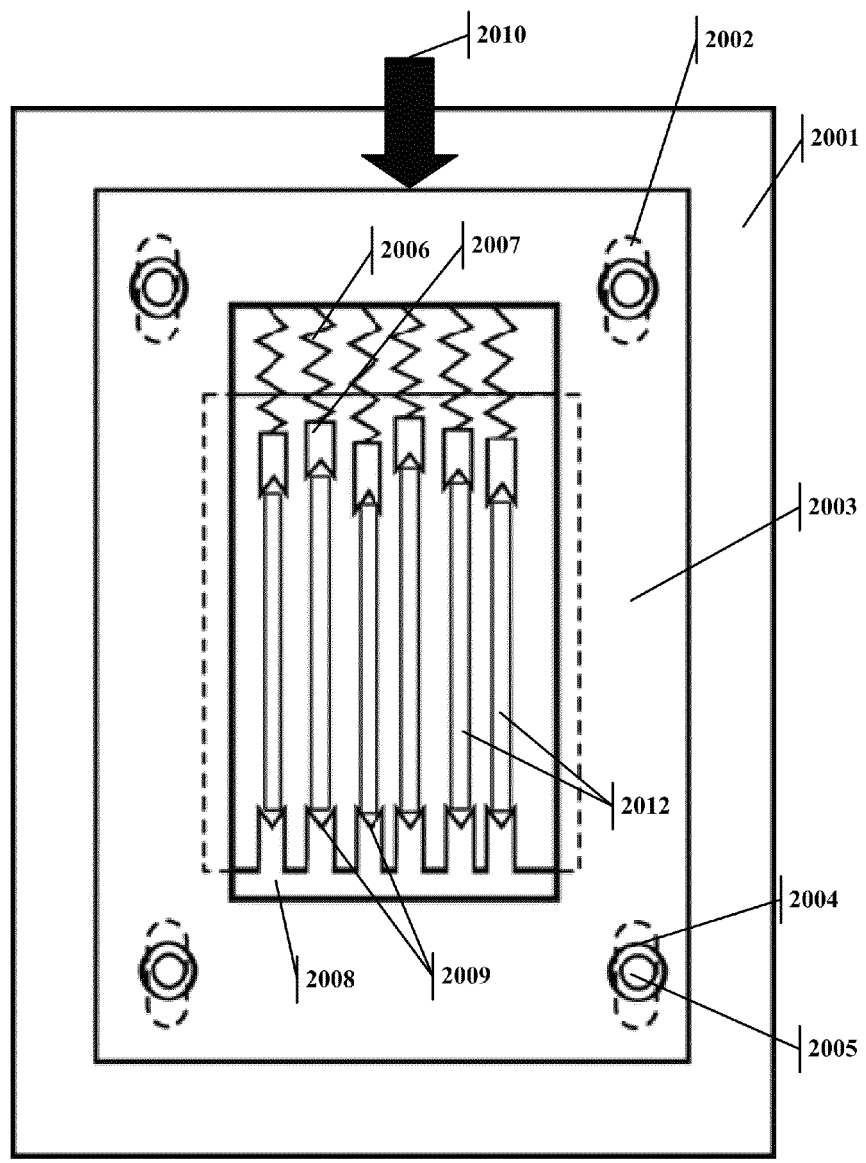
FIG. 20 illustrates a further embodiment of a probe comb holder.

In another example, springs are directly integrated within either plate 1401, 1402 or 1403 as depicted in FIG. 14, instead of, or in addition to, the springs build along with each individual probe combs. FIG. 20 depicts one embodiment of a plate 2003 with integrated springs 2006 that can individually bend to accommodate probe comb-to-probe comb geometrical variation. FIG. 20 illustrates the top view of a probe comb holder. In this embodiment the probe comb holding system comprises only two plates. In this embodiment, the base plate 2001 corresponds to plate 1405 in FIG. 14. The base plate 2001, with oblong holes 2002, is aligned and stacked along with a top plate 2003, with smaller holes 2004. Both plates are loosely aligned using a set of pins 2005 inserted in both holes 2004 and 2002. The top plate 2003 is equipped with a series of mechanical springs 2006. Each spring is connected to a structure 2007 that has a characteristic triangular cut on its distal end, as previously seen in FIG. 16. The bottom plate 2001 is also equipped with structure 2008 exhibiting a triangular cut as well. The only difference between plate 2001 and 2003 is the absence of mechanical springs in plate 2001. Vertical probe combs 2008, herein represented from the top view as a series of rectangles 2009, have been inserted vertically and a force 2010 has already been applied to plate 2002, forcing plate 2002 to move with reference to plate 2001. As a result, the probe combs 2012 are squeezed on one side by structure 2007 and on the other by structure 2008. In the event that probe combs 2012 have a length that vary by the full extent of the minimum and maximum tolerances afforded by any of the machining steps that lead to the fabrication of probe combs 2012, and as long as springs 2006 are designed to flex more or less and accommodate the aforementioned variation in length, pushing plate 2002, with reference to plate 2001, will result in effectively pushing and securing all the probe combs, regardless of their length.

Figure 21:
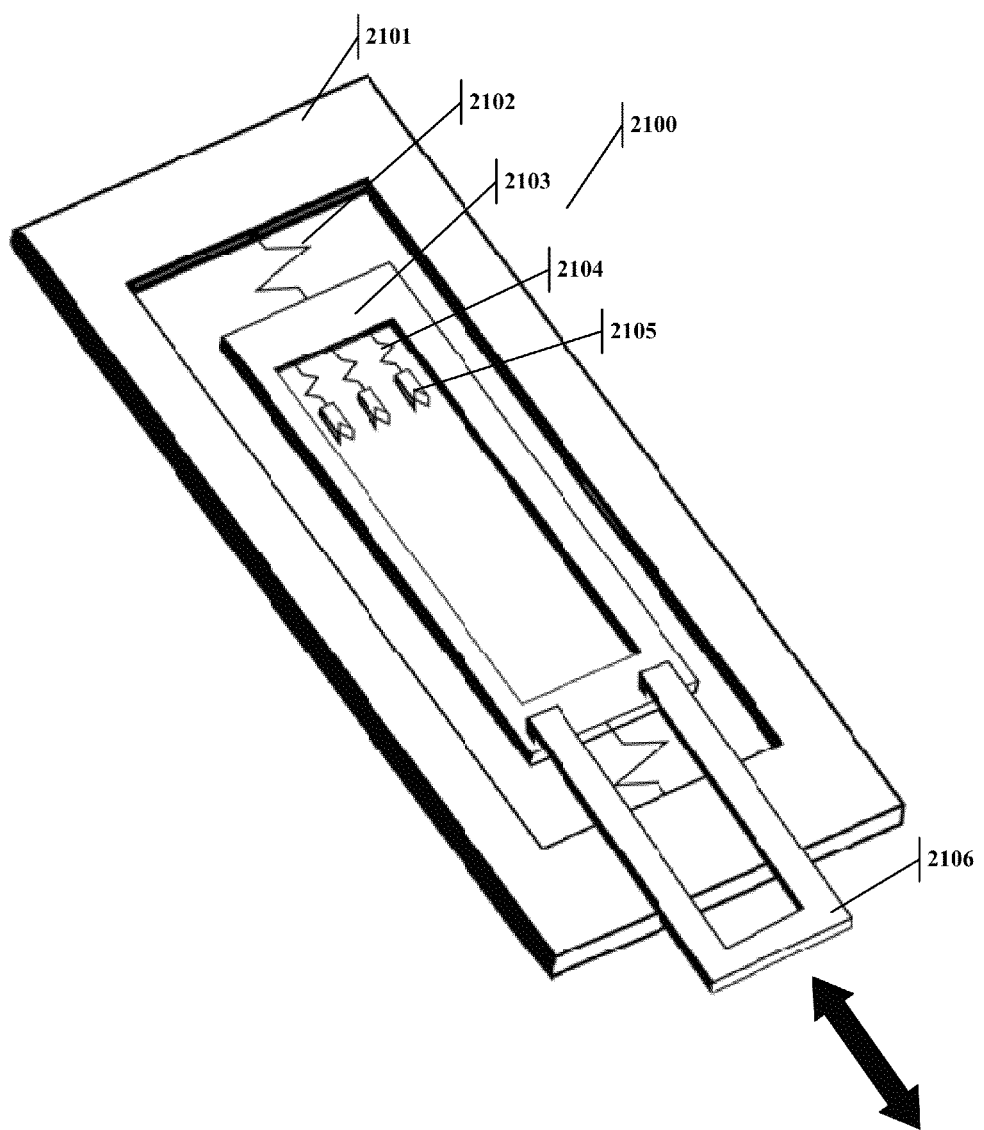
FIG. 21 illustrates a further embodiment of a probe comb holder.

FIG. 21 presents yet another example of a plate. In this example, the plate motion is made possible thanks to the presence of a set of springs. The plate 2100 comprises a frame 2101, a series of springs 2102 holding an inner frame 2103. The inner frame 2103 comprises a series of secondary springs 2104 and a series of structure with a triangular cut 2105. Attached to frame 2103 is a handle 2106 which provides a means to apply a force directly to the inner frame 2103, with reference to the outer frame 2101. Structure 2100 is meant to avoid the use of oblong holes and pins in order to allow a differential movement of one plate to another, as shown in FIG. 20.

In one embodiment, Plate 2100 is machined out of Single Crystal Silicon, using methods such as deep reactive ion etching, to create all the necessary features described in FIG. 21. In another embodiment, all the plates, including the bottom plate depicted in FIG. 14 are machined out of Single Crystal Silicon. In one embodiment, all the parts are stacked on top of one another. In another embodiment all the parts made of silicon are bonded together using techniques including, but not limited to, silicon fusion bonding, anodic bonding, gold-gold bonding, solder or eutectic bonding, etc.

Figure 22:
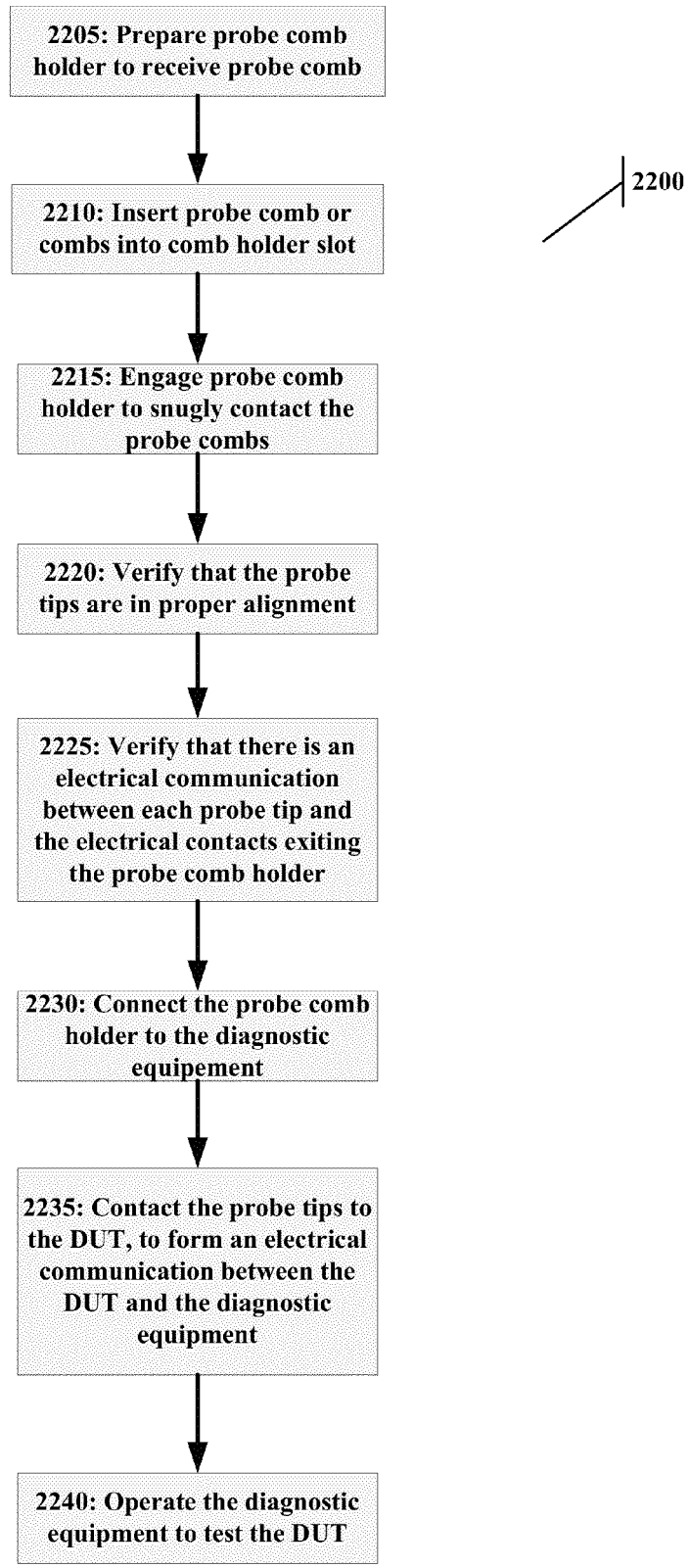
FIG. 22 is a flowchart showing a method of assembling an apparatus for use in testing electronic devices, where the apparatus contains both a probe comb and probe comb holder.

Now referring to FIG. 22, a method 2200 for assembling an apparatus for use in testing electronic devices is shown. First the probe comb holder, such as the ones describe above is prepared to receive a probe comb at step 2205. Then at step 2210 a probe comb or a plurality of probe combs is inserted into the slot on the probe comb holder. Next, at step 2215 the probe comb holder is engaged such that the holder snugly contacts the probe combs. At this step the probe combs should have very little if any freedom of movement within the probe comb holder, and with the use of the self alignment structures discussed above, the probe combs should be automatically in proper alignment. Nevertheless, it is optional, but preferable, to verify that the probe tips are in proper alignment as shown in step 2220. It is also optional, but preferable, to verify at step 2225 that there is an electrical communication between each probe tip and the electrical contacts exiting the probe comb holder. The absence of such an electrical communication will adversely affect the performance of the testing apparatus. The probe comb can then be connected to the diagnostic equipment at step 2230.

Now the apparatus (i.e., the probe comb holder and probe comb complex) can be used to test a DUT. At step 2235 the probe tips contact the DUT to form an electrical communication between the DUT and the diagnostic equipment. And at step 2240, the diagnostic equipment can run any tests on the DUT to verify that the DUT is operating properly.

One of the benefits of the system and methods describe herein is the relative ease a defect can be repaired. In traditionally constructed probe cards (i.e., fully constructed used MEMS), when an individual probe is damaged, a technician must release that probe from the substrate, and carefully place a new probe in its place. Precise positioning is essential, otherwise the probe tip will not be planar with the adjacent probe tips, or worse, the replacement probe may be installed such that it physically interferes with the operation of adjacent probes. Because the probe comb holders described above can accept and fix probe combs with relative ease, when a probe is damaged, that particular probe comb can be released from the holder. At that time, a replacement probe comb can be reinserted into the probe comb holder and fixed, which will automatically align it into the proper position.

Figure 23:
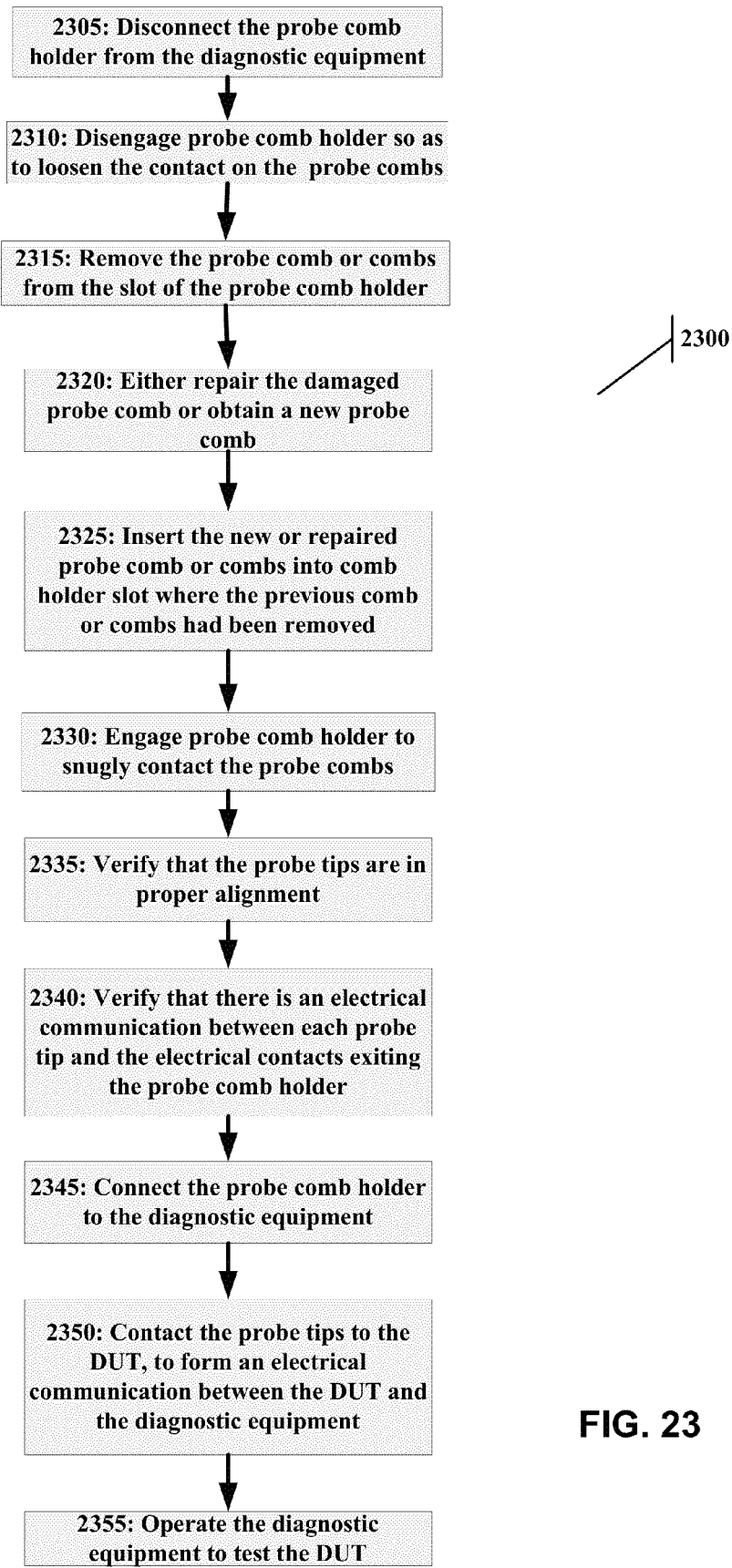
FIG. 23 is a flowchart showing a method of disassembling an apparatus for use in testing electronic devices, including steps for replacing specific probe combs and reassembling the apparatus.

A repair or replacement method 2300 is shown in FIG. 23. First at step 2305 the probe comb holder is disconnected from the diagnostic equipment and the probe comb is disengaged so as to loosen the contact the probe comb holder has on the probe combs (step 2310). The damaged probe combs, or those that are sought to be replaced, are removed from the slot on the probe comb holder at step 2315. The damages probe combs are either repaired or replaced with new or remanufactured probe combs at step 2320. At this point, the steps of inserting and engaging the probe comb (shown as steps 2325-2355) are the same as those already discussed in regards to method 2200. It is important to note that method 2300 is not limited to the repair of damaged probes, but can also be used to replace any probe comb.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein. Moreover, the applicants expressly do not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. An apparatus for testing an electronic device comprising:
    a plurality of probes, each probe comprising a shank and a probe tip located at the distal end of the shank, wherein the shank elastically deforms when the probe tip contacts a device under test (DUT);
    a common foot connected to proximal end of each shank, the foot is capable of elastic deformation when the probe tip contacts the DUT;
    a substrate connected to the common foot; and
    a plurality of isolated electrical vertical interconnected access (vias) connecting the each probe tip to the an electrically isolated region of the substrate, such that each probe tip of the plurality is capable of conducting an electrical current from the DUT to the region of the substrate.

2. The apparatus of claim 1, wherein for each of the plurality of probes, the shank is adapted to elastically deform independently of the other probes when the probe tip contacts a device under test.

3. The apparatus of claim 1, wherein the plurality of probes is constructed of a material consisting of the group of copper, gold, nickel, nickel manganese, and beryllium copper.

4. The apparatus of claim 1, wherein a portion of the vias is the shank.

5. The apparatus of claim 1, wherein the common foot is comprised of two regions, wherein the first region has a first stiffness and is connected to the shank and the second region has a second stiffness and is connected to the substrate, and the first and second stiffnesses are different.

6. The apparatus of claim 5, wherein the second region is stiffer than the first region.

7. The apparatus of claim 1, wherein the vias are exposed on the outside of the shank.

8. The apparatus of claim 1, wherein a plurality of probes comprises two combs of parallel probes, wherein the combs are separated by an insulating material.

9. The apparatus of claim 8, wherein the insulating material is selected from a group consisting of: a polymer, non-conductive ceramic and glass.

10. The apparatus of claim 8, wherein the combs comprise an electrical element, wherein electrical element is selected from a group consisting of: resistors, inductors, thermocouples and resistive heaters.

11. The apparatus of claim 1, wherein the probe is constructed from a single crystal silicon.

12. The apparatus of claim 1, wherein the substrate is comprised of two layers of silicon with an insulating layer in between.

13. The apparatus of claim 1, wherein the plurality of probes form a probe comb.

14. The apparatus of claim 13, wherein the probe comb comprises a first spring structure adapted to exert first force against a probe comb holder.

15. The apparatus of claim 14, wherein the probe comb comprises a second spring structure adapted to exert second force against the probe comb holder in a direction that is substantially orthogonal to the first force exerted by the first spring structure.

16. The apparatus of claim 13, further comprising a probe comb holder, wherein the holder is planar and has at least one slot, and wherein the probe comb is disposed of in the slot.

17. The apparatus of claim 16, wherein the probe comb holder has a plurality of self alignment structures.

18. The apparatus of claim 17, wherein the probe comb comprises a second spring structure adapted to exert second force against the probe comb holder in a direction that is substantially orthogonal to the first force exerted by the first spring structure.

19. The apparatus of claim 16, wherein the probe comb comprises a first spring structure adapted to exert first force against the probe comb holder.

20. The apparatus of claim 16, wherein the probe comb holder comprises a plurality of plates that slide at least partially independent of each other, the plates adapted to restrict the movement of the probe comb.

* * * * *